(12) United States Patent
Hsu et al.

(10) Patent No.: US 11,942,442 B2
(45) Date of Patent: Mar. 26, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Sen-Kuei Hsu, Kaohsiung (TW); Hsin-Yu Pan, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 122 days.

(21) Appl. No.: 17/080,826

(22) Filed: Oct. 26, 2020

(65) Prior Publication Data

US 2021/0043590 A1     Feb. 11, 2021

Related U.S. Application Data

(63) Continuation of application No. 16/197,334, filed on Nov. 20, 2018, now Pat. No. 10,840,197.

(Continued)

(51) Int. Cl.
*H01L 23/66*     (2006.01)
*H01L 21/56*     (2006.01)
(Continued)

(52) U.S. Cl.
CPC .............. *H01L 23/66* (2013.01); *H01L 21/56* (2013.01); *H01L 21/76885* (2013.01);
(Continued)

(58) Field of Classification Search
CPC ........ H01Q 1/2283; H01Q 1/48; H01L 24/24; H01L 23/66; H01L 23/49838; H01L 23/49827; H01L 23/49816; H01L 23/3128; H01L 24/25; H01L 23/49822; H01L 23/481; H01L 27/0922; H01L 21/823857; H01L 27/0924; H01L 21/823821;
(Continued)

(56) References Cited

U.S. PATENT DOCUMENTS 8,993,380 B2    3/2015   Hou et al.
9,000,584 B2    4/2015   Lin et al.
(Continued)

*Primary Examiner* — Jarrett J Stark
(74) *Attorney, Agent, or Firm* — JCIPRNET

(57) ABSTRACT

A package structure includes a first redistribution circuit structure, a second redistribution circuit structure, a semiconductor die, a waveguide structure, and an antenna. The semiconductor die is sandwiched between and electrically coupled to the first redistribution circuit structure and the second redistribution circuit structure. The waveguide structure is located aside and electrically coupled to the semiconductor die, wherein the waveguide structure includes a part of the first redistribution circuit structure, a part of the second redistribution circuit structure and a plurality of first through vias each connecting to the part of the first redistribution circuit structure and the part of the second redistribution circuit structure. The antenna is located on the semiconductor die, wherein the second redistribution circuit structure is sandwiched between the antenna and the semiconductor die, and the antenna is electrically communicated with the semiconductor die through the waveguide structure.

20 Claims, 30 Drawing Sheets

Related U.S. Application Data

(60) Provisional application No. 62/752,372, filed on Oct. 30, 2018.

(51) Int. Cl.

| | | |
|---|---|---|
| *H01L 21/768* | (2006.01) | |
| *H01L 23/00* | (2006.01) | |
| *H01L 23/31* | (2006.01) | |
| *H01L 23/522* | (2006.01) | |

(52) U.S. Cl.
CPC ...... *H01L 23/3114* (2013.01); *H01L 23/5226* (2013.01); *H01L 24/09* (2013.01); *H01L 24/17* (2013.01); *H01L 24/32* (2013.01); *H01L 24/73* (2013.01); *H01L 2223/6627* (2013.01); *H01L 2223/6677* (2013.01); *H01L 2224/0231* (2013.01); *H01L 2224/02373* (2013.01); *H01L 2224/0401* (2013.01)

(58) Field of Classification Search
CPC ............... H01L 29/517; H01L 29/0649; H01L 21/823842; H01L 21/28008; H05K 1/181; H01P 1/15
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,236,328 B1* | 1/2016 | Leobandung | H01L 21/76834 |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2* | 11/2016 | Yu | H01L 25/0657 |
| 9,666,502 B2* | 5/2017 | Chen | H01L 24/19 |
| 9,735,131 B2* | 8/2017 | Su | H01L 21/6835 |
| 9,761,547 B1* | 9/2017 | Kunkee | H01L 23/5385 |
| 10,267,990 B1* | 4/2019 | Yu | H05K 1/181 |
| 10,410,963 B1* | 9/2019 | Weis | H01L 23/4985 |
| 10,411,328 B2* | 9/2019 | Liao | H01Q 21/0087 |
| 10,511,080 B2* | 12/2019 | So | H01Q 1/38 |
| 10,515,886 B2* | 12/2019 | Yazdani | H01L 23/49827 |
| 10,840,197 B2* | 11/2020 | Hsu | H01L 21/76885 |
| 2004/0188826 A1* | 9/2004 | Palanduz | H01L 24/17 257/E23.079 |
| 2007/0065594 A1* | 3/2007 | Chiang | C23C 16/08 118/728 |
| 2011/0042795 A1* | 2/2011 | Knickerbocker | H01L 23/49827 257/E21.585 |
| 2012/0061795 A1* | 3/2012 | Yen | H01L 21/76898 257/E21.334 |
| 2014/0239465 A1* | 8/2014 | Yen | H01L 24/97 257/659 |
| 2014/0264635 A1* | 9/2014 | Chen | H01L 29/6656 438/300 |
| 2015/0048471 A1* | 2/2015 | Hasch | H01L 23/528 257/664 |
| 2015/0084194 A1* | 3/2015 | Molzer | H01L 23/481 257/774 |
| 2016/0013867 A1* | 1/2016 | Moss | G02F 1/0123 438/59 |
| 2016/0028368 A1* | 1/2016 | Shealy | H01L 21/7605 310/346 |
| 2016/0043455 A1* | 2/2016 | Seler | H01P 11/003 29/601 |
| 2017/0162524 A1* | 6/2017 | Wang | H01L 23/66 |
| 2017/0187094 A1* | 6/2017 | Cook | H01Q 1/2283 |
| 2017/0236776 A1* | 8/2017 | Huynh | H01L 23/49822 438/26 |
| 2017/0278806 A1* | 9/2017 | Kuo | H01L 23/49827 |
| 2018/0151389 A1* | 5/2018 | Kuo | H01L 23/552 |
| 2018/0175476 A1* | 6/2018 | Teshiba | H01L 25/18 |
| 2018/0191053 A1* | 7/2018 | Ndip | H01L 23/5384 |
| 2018/0205134 A1* | 7/2018 | Khan | H01Q 5/314 |
| 2018/0342470 A1* | 11/2018 | Liao | H01L 23/552 |
| 2019/0035737 A1* | 1/2019 | Wu | H01L 21/4889 |
| 2019/0067775 A1* | 2/2019 | Bae | H01P 3/16 |
| 2019/0131245 A1* | 5/2019 | Maxim | H01L 23/552 |
| 2019/0280368 A1* | 9/2019 | Khan | H01Q 1/2283 |
| 2019/0288366 A1* | 9/2019 | Kirino | G01S 13/345 |
| 2019/0348747 A1* | 11/2019 | Liu | H01L 24/20 |
| 2019/0348748 A1* | 11/2019 | Liu | H01L 23/5386 |
| 2019/0348756 A1* | 11/2019 | Liu | H01Q 9/16 |
| 2019/0378801 A1* | 12/2019 | Leitgeb | H01L 23/552 |
| 2019/0393171 A1* | 12/2019 | Liao | H01L 21/4853 |
| 2019/0393172 A1* | 12/2019 | Pietambaram | H01L 24/19 |
| 2020/0006235 A1* | 1/2020 | Aleksov | H01L 24/17 |
| 2020/0013735 A1* | 1/2020 | Liu | H01L 23/481 |
| 2020/0044303 A1* | 2/2020 | Shin | H05K 3/42 |
| 2021/0043590 A1* | 2/2021 | Hsu | H01L 23/5389 |

\* cited by examiner

PACKAGE STRUCTURE AND MANUFACTURING METHOD THEREOF

CROSS-REFERENCE TO RELATED APPLICATION

This application is a continuation application of and claims the priority benefit of a prior application Ser. No. 16/197,334, filed on Nov. 20, 2018, now allowed, which claims the priority benefits of U.S. provisional application Ser. No. 62/752,372, filed on Oct. 30, 2018. The entirety of each of the above-mentioned patent applications is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
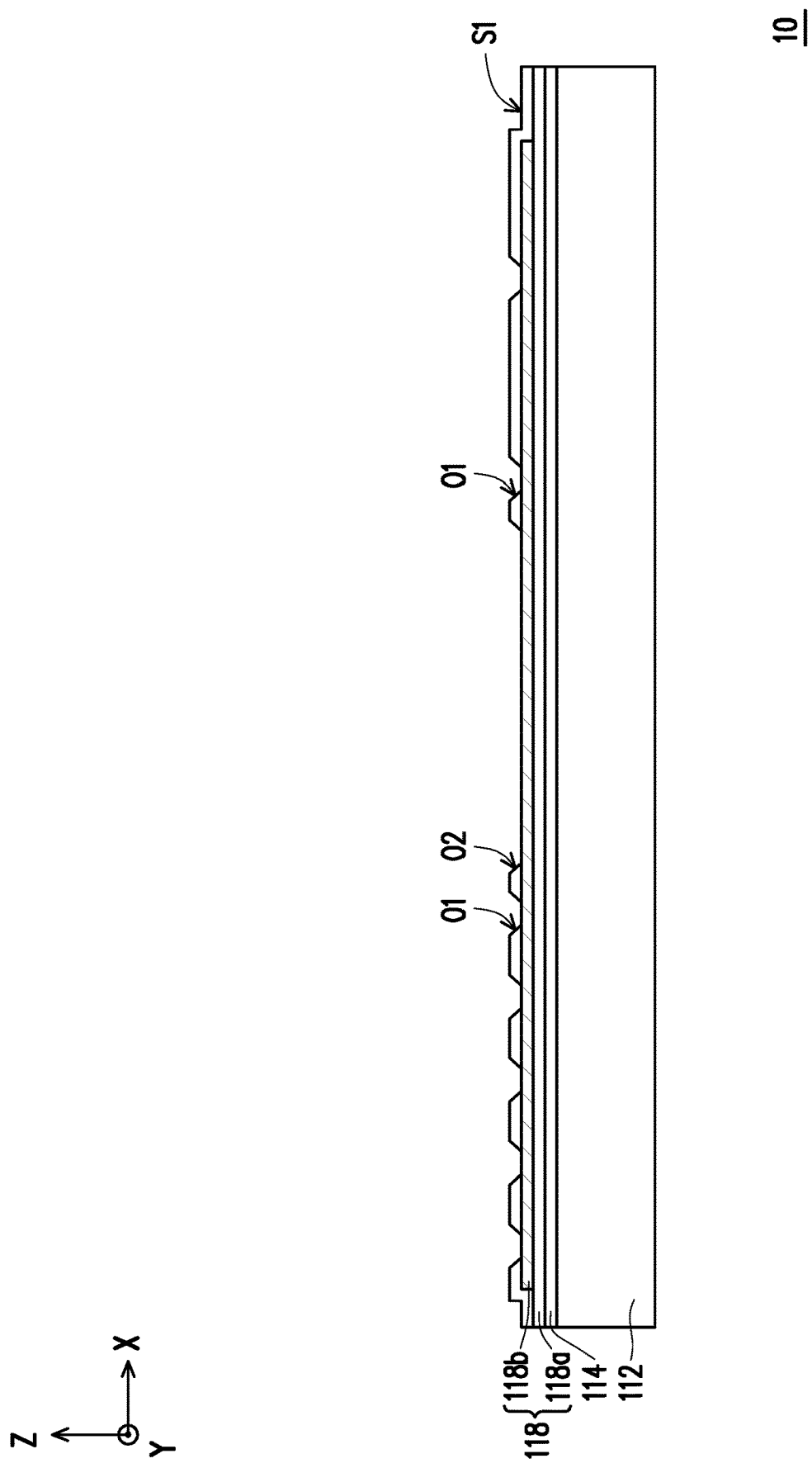
FIG. 1 to FIG. 12 are schematic cross-sectional views of various stages in a manufacturing method of a package structure according to some exemplary embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
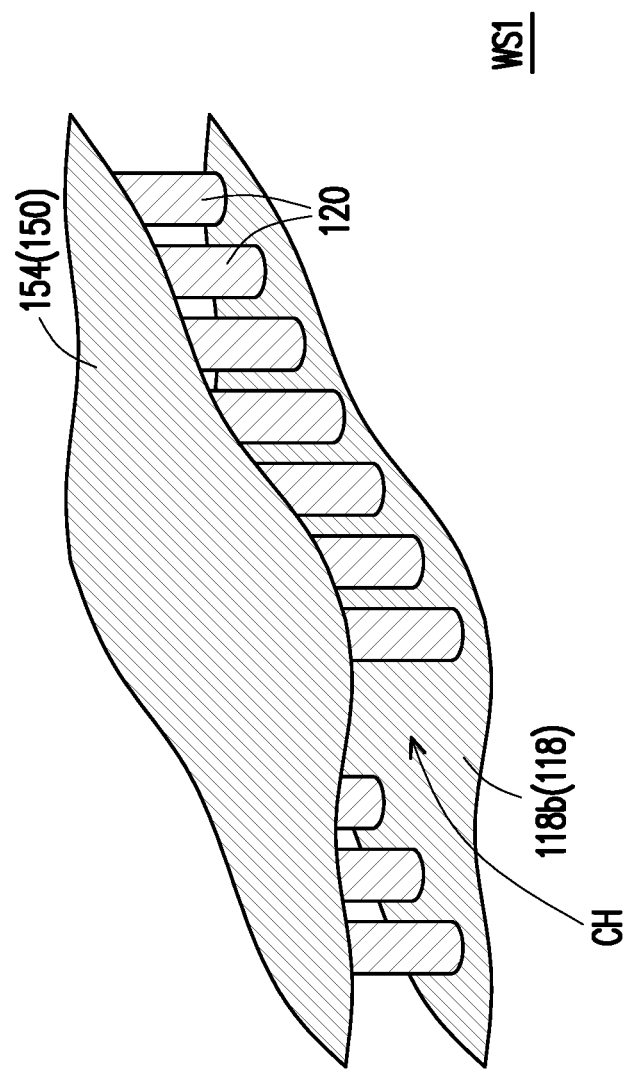
FIG. 13 is a schematic three-dimensional, partially enlarged perspective view of a waveguide structure in a package structure according to some exemplary embodiments of the disclosure.
Figure 14:
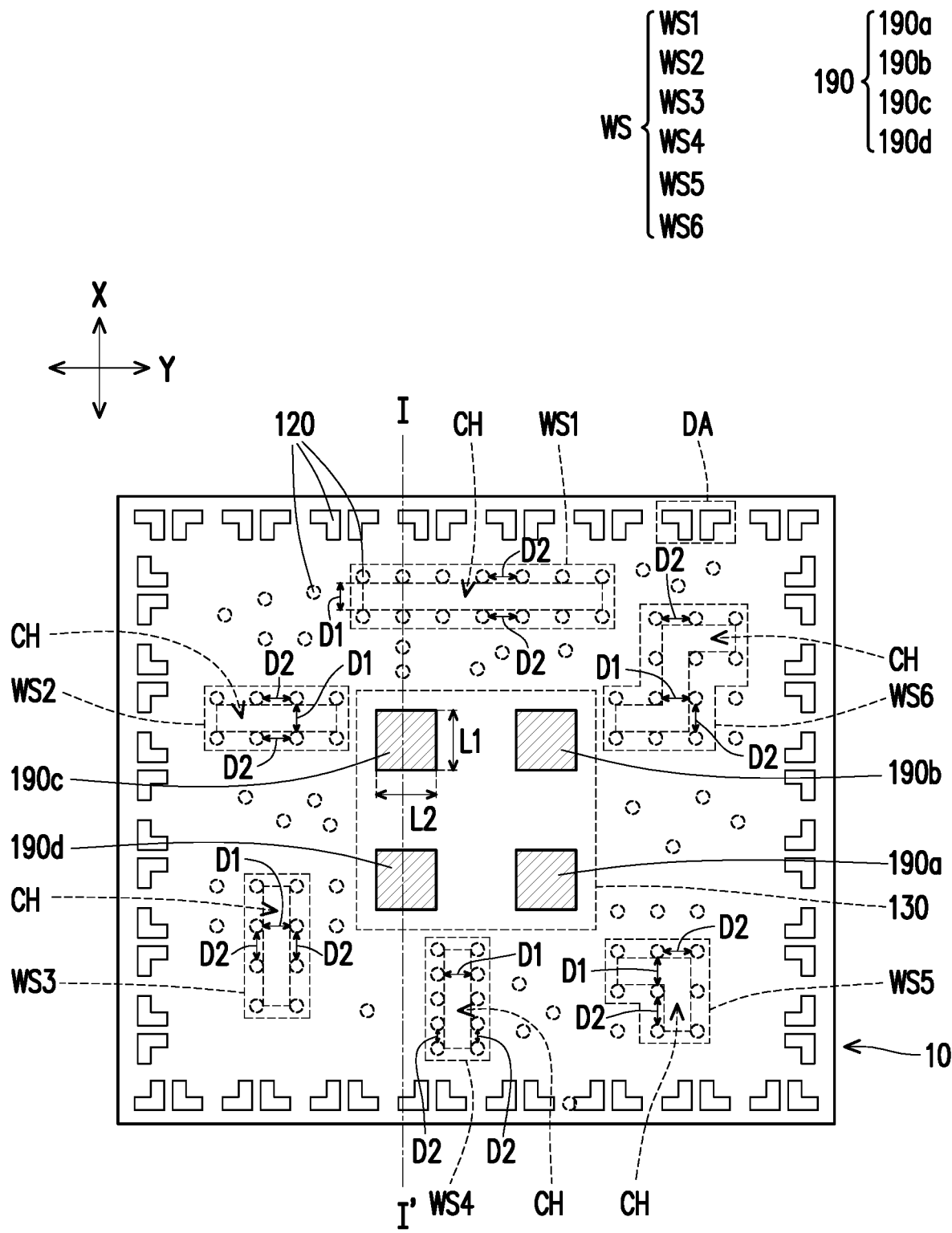
FIG. 14 is a schematic top view illustrating a relative position between antennas, waveguide structures and a semiconductor die of a package structure according to some exemplary embodiments of the disclosure.

FIG. 1 to FIG. 12 are schematic cross-sectional views of various stages in a manufacturing method of a package structure according to some exemplary embodiments of the disclosure. FIG. 13 is a schematic three-dimensional, partially enlarged perspective view of a waveguide structure in a package structure according to some exemplary embodiments of the disclosure. FIG. 14 is a schematic top view illustrating a relative position between antennas, waveguide structures and a semiconductor die of a package structure according to some exemplary embodiments of the disclosure, where FIG. 1 to FIG. 12 are the schematic cross-sectional views taken along a cross-sectional line I-I' depicted in FIG. 14. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 12, one (semiconductor) chip or die is shown to represent plural (semiconductor) chips or dies of the wafer, and a package structure 10 is shown to represent a package structure obtained following the manufacturing method, for example. In other embodiments, two (semiconductor) chips or dies are shown to represent plural (semiconductor) chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 is provided. In some embodiments, the carrier 112 may be a glass carrier or any suitable carrier for carrying a semiconductor wafer or a reconstituted wafer for the manufacturing method of the semiconductor package. In some embodiments, the carrier 112 is coated with a debond layer 114. The material of the debond layer 114 may be any material suitable for bonding and debonding the carrier 112 from the above layer(s) or any wafer(s) disposed thereon.

In some embodiments, the debond layer 114 may include a dielectric material layer made of a dielectric material including any suitable polymer-based dielectric material (such as benzocyclobutene ("BCB"), polybenzoxazole ("PBO")). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be levelled and may have a high degree of coplanarity. In certain embodiments, the debond layer 114 is, for example, a LTHC layer with good chemical resistance, and such layer enables room temperature debonding from the carrier 112 by applying laser irradiation, however the disclosure is not limited thereto.

In an alternative embodiment, a buffer layer (not shown) may be coated on the debond layer 114, where the debond layer 114 is sandwiched between the buffer layer and the carrier 112, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on to FIG. 1, in some embodiments, a redistribution circuit structure 118 is formed over the carrier 112. For example, in FIG. 1, the redistribution circuit structure 118 is formed on the debond layer 114, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the dielectric layers 118a and the metallization layer 118b included in the redistribution circuit structure 118 is not limited thereto, and may be designated and selected based on the demand. For example, the numbers of the dielectric layers 118a and the metallization layer 118b may be one or more than one.

In certain embodiments, the portions of a top surface of the metallization layer 118b are exposed by openings O1, O2 formed in the topmost layer of the dielectric layers 118a, as shown in FIG. 1. For example, the topmost layer of the dielectric layers 118a includes seven openings O1 and one opening O2 as shown in FIG. 1, where the opening O2 is surrounded by and separated from the openings O1. However, the disclosure is not limited thereto. The numbers of the openings O1 and the opening O2 formed in the topmost layer of the dielectric layers 118a is not limited thereto, and may be designated and selected based on the demand.

In certain embodiments, the material of the dielectric layers 118a may be polyimide, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a are formed by suitable fabrication techniques such as spin-on coating process, chemical vapor deposition (CVD) process, plasma-enhanced chemical vapor deposition (PECVD) process or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
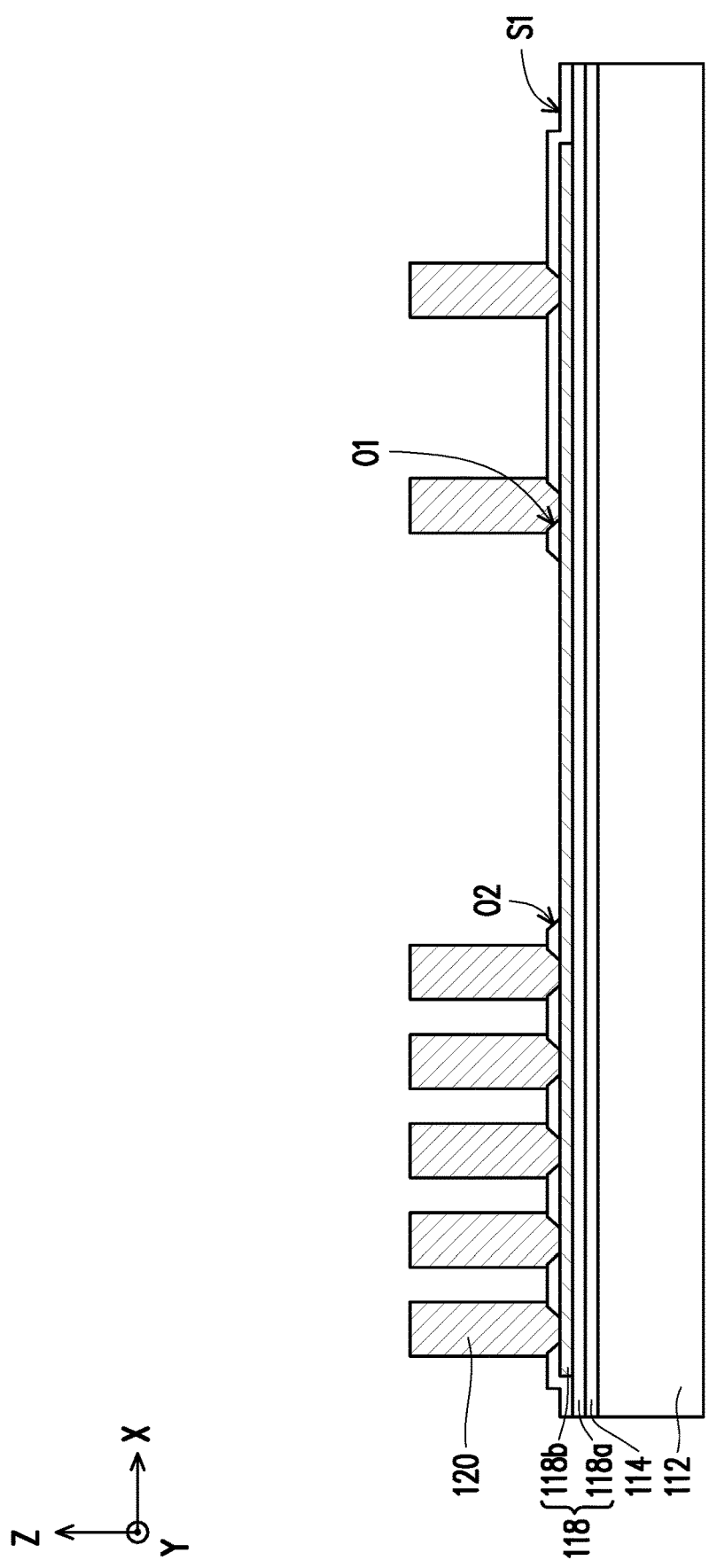

Referring to FIG. 2, in some embodiments, through vias 120 are formed on the redistribution circuit structure 118 (e.g. a first side S1 of the redistribution circuit structure 118). In some embodiments, the through vias 120 may be through integrated fan-out (InFO) vias. In some embodiments, the through vias 120 are arranged along but not on a cutting line (not shown) between two package structures 10. For simplification, only seven through vias 120 are presented in FIG. 2 for illustrative purposes, however it should be noted that more than seven through vias may be formed; the disclosure is not limited thereto. The number of the through vias 120 may be designated and selected based on the demand, and adjusted by changing the number of the openings O1.

In some embodiments, the through vias 120 are formed by photolithography, plating, photoresist stripping processes or any other suitable method. For example, the plating process may include an electroplating plating, an electroless plating, or the like. In one embodiment, the through vias 120 may be formed by forming a mask pattern (not shown) covering the redistribution circuit structure 118 with openings exposing the top surface of the metallization layer 118b exposed by the openings O1 formed in the topmost layer of the dielectric layers 118a, forming a metallic material filling the openings formed in the mask pattern and the openings O1 to form the through vias 120 by electroplating or deposition and then removing the mask pattern. In one embodiment, the mask pattern may be removed by acceptable ashing process and/or photoresist stripping process, such as using an oxygen plasma or the like. The disclosure is not limited thereto. In one embodiment, the material of the through vias 120 may include a metal material such as copper or copper alloys, or the like. However, the disclosure is not limited thereto.

Figure 3:
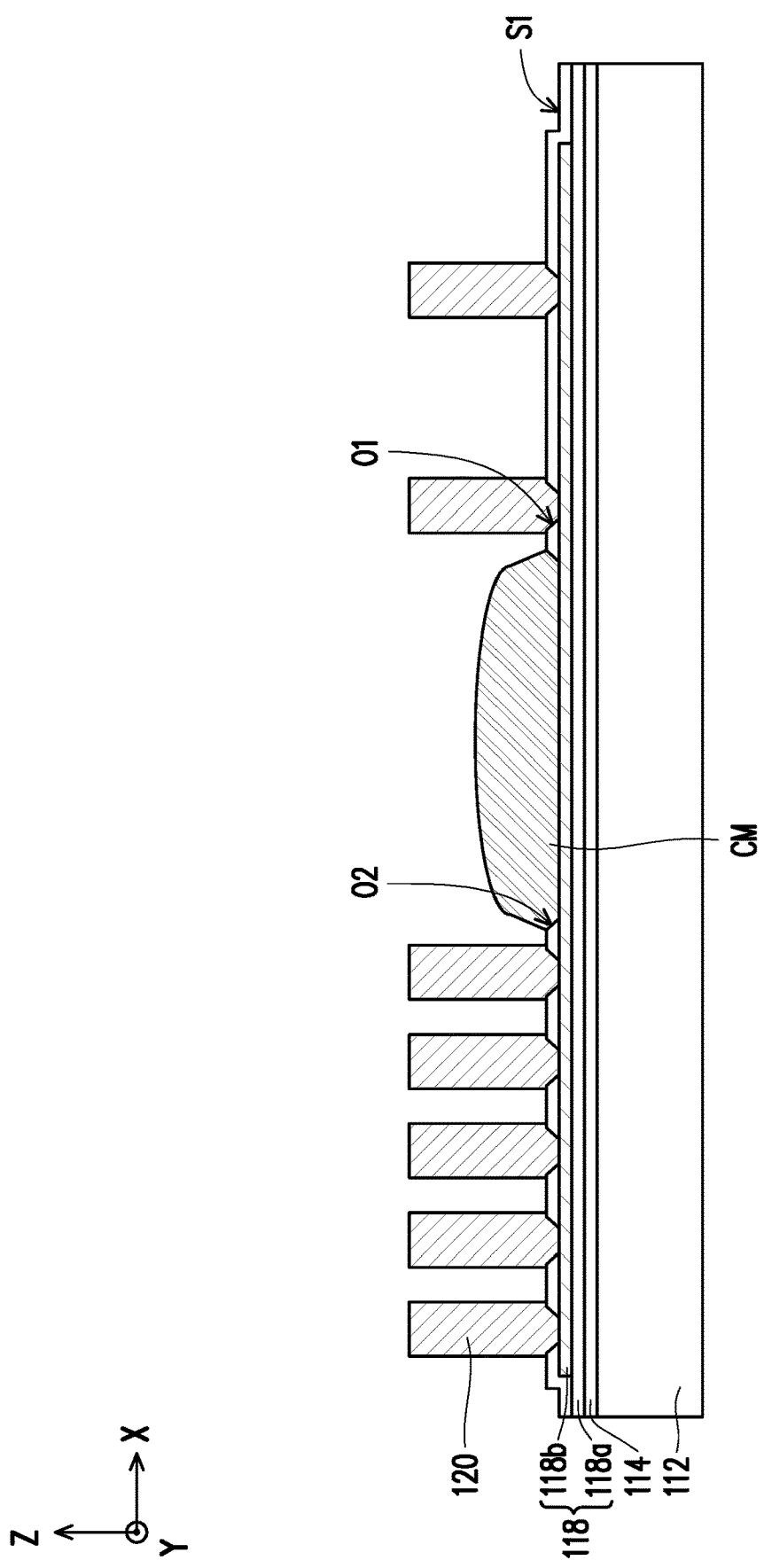

Referring to FIG. 3, in some embodiments, a connecting material CM is provided and formed over the redistribution circuit structure 118. The connecting material CM is, for example, conductive adhesive (such as silver paste, solder paste or the like), and is formed by coating, screen printing, or dispensing. However, the disclosure is not limited thereto. As shown in FIG. 3, in some embodiments, the connecting material CM is formed on the redistribution circuit structure 118 and at least fills up the opening O2, where the connecting material CM is at least in contact with the metallization layer 118b but not in contact with the through vias 120. In an alternative embodiment, the connecting material CM may be further in contact with the topmost layer of the dielectric layers 118a in addition to the metallization layer 118b.

Figure 4:
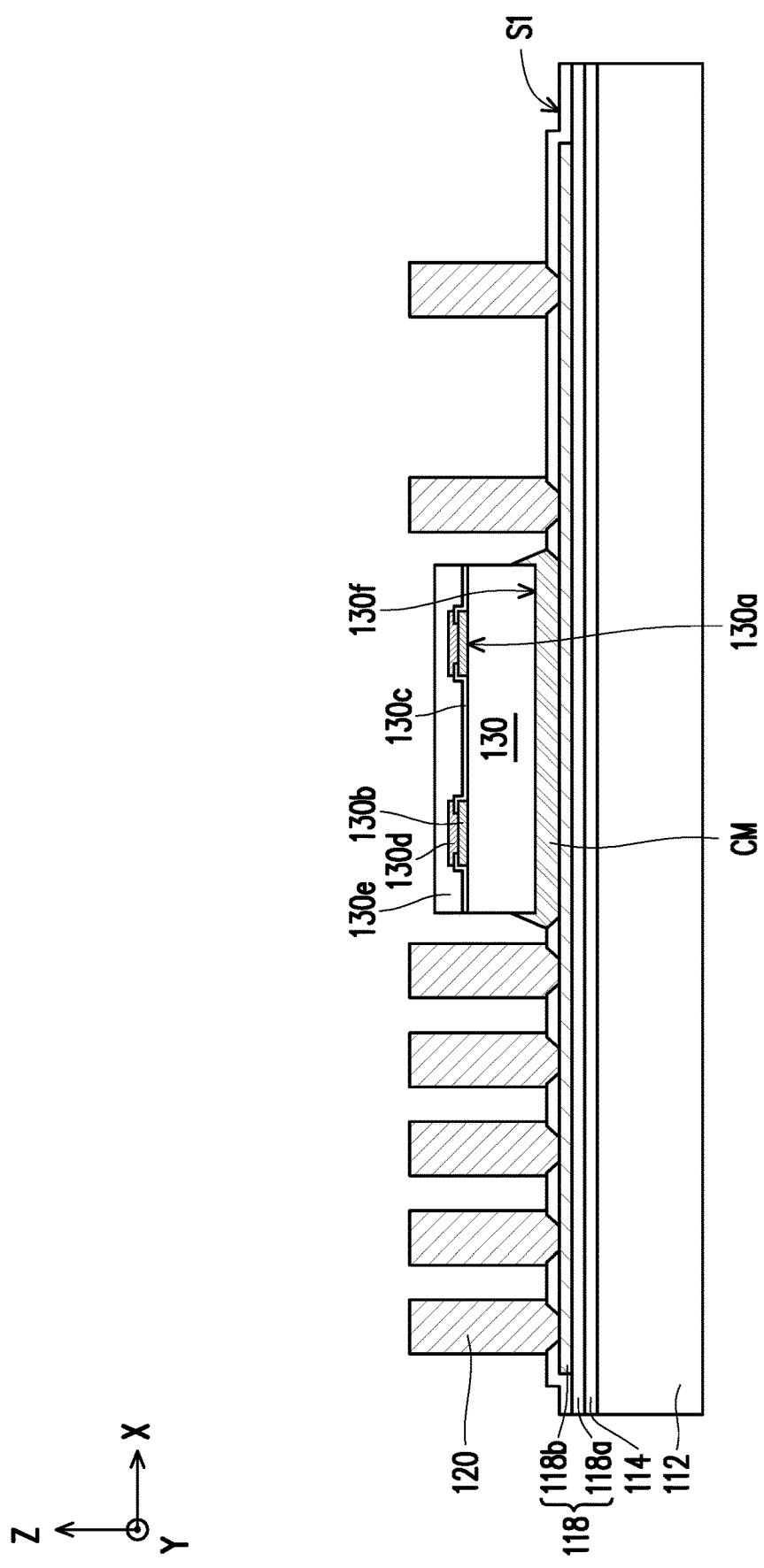

Referring to FIG. 4, in some embodiments, one or more semiconductor dies are provided. For example, as shown in FIG. 4, one semiconductor die 130 is provided and placed over the redistribution circuit structure 118, however the disclosure is not limited thereto. In some embodiments, the semiconductor die 130 is disposed on the redistribution circuit structure 118 (e.g. the first side S1 of the redistribution circuit structure 118) and over the carrier 112 through the connecting material CM. In some embodiments, the connecting material CM is located between the semiconductor die 130 and the redistribution circuit structure 118, and the connecting material CM physically contacts a backside surface 130f of the semiconductor die 130 and the redistribution circuit structure 118 (e.g. the topmost layer of the dielectric layers 118a of the redistribution circuit structure 118). In some embodiments, due to the connecting material CM provided between the semiconductor die 130 and the redistribution circuit structure 118, the semiconductor die 130 and the redistribution circuit structure 118 are stably adhered to each other. In some embodiments, the connecting material CM further physically contacts at least a portion of a sidewall of the semiconductor die 130. In some embodiments, the redistribution circuit structure 118 is referred to as a back-side redistribution layer of the semiconductor die 130.

In some embodiments, as shown in FIG. 4, the semiconductor die 130 includes an active surface 130a, a plurality of pads 130b distributed on the active surface 130a, a passivation layer 130c covering the active surface 130a and a portion of the pad 130b, a plurality of conductive pillars 130d connected to the portion of the pads 130b, a protection layer 130e covering the pads 130b and the conductive pillars 130d, and the backside surface 130f opposite to the active surface 130a. The pads 130b are partially exposed by the passivation layer 130c, the conductive pillars 130d are disposed on and electrically connected to the pads 130b, and the protection layer 130e covers the passivation layer 130c and the conductive pillars 130d.

In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a PBO layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the semiconductor die 130 may exclude the conductive pillars 130d and the protection layer 130e. For example, the semiconductor die 130 may include the pads 130b distributed on the active surface 130a, the passivation layer 130c covering the active surface 130a and a portion of the pad 130b, the backside surface 130f opposite to the active surface 130a. The disclosure is not limited thereto.

As shown in FIG. 4, only one semiconductor die 130 is presented for illustrative purposes, however it should be noted that one or more semiconductor dies may be provided. In some embodiments, the semiconductor die 130 described herein may be referred to as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred to as a chip or an IC of combination-type, and the semiconductor die 130 may be a WiFi chip simultaneously including both of a RF chip and a digital chip. The disclosure is not limited thereto.

Continued on FIG. 4, for example, the through vias 120 are located aside of a location of the semiconductor die 130, and are mechanically and electrically connected to the metallization layer 118b of the redistribution circuit structure 118. In FIG. 4, a height of the through vias 120 is greater than a height of the semiconductor die 130, for example; however, the disclosure is not limited thereto. In an alternative embodiment, the height of the through vias 120 may be less than or substantially equal to the height of the semiconductor die 130.

Figure 5:
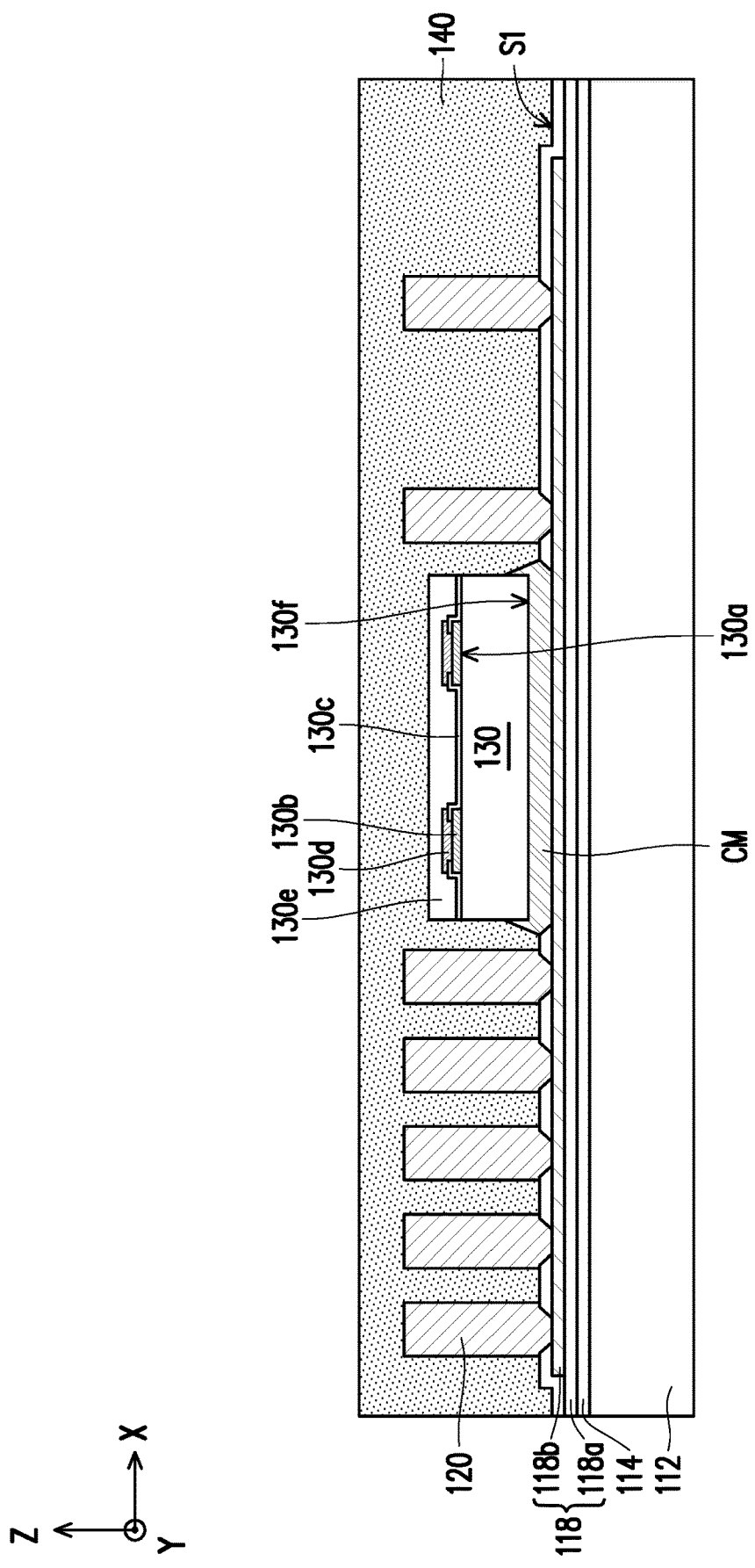

Referring to FIG. 5, in some embodiments, the through vias 120 and the semiconductor die 130 are encapsulated in an insulating encapsulation 140. In some embodiments, the insulating encapsulation 140 is formed on the redistribution circuit structure 118 and over the carrier 112. As shown in FIG. 5, the insulating encapsulation 140 at least fills up the gaps between the through vias 120 and between the through vias 120, the semiconductor die 130 and the connecting material CM. In some embodiments, the insulating encapsulation 140 covers the redistribution circuit structure 118 and the semiconductor die 130. In certain embodiments, as shown in FIG. 5, the through vias 120 and the semiconductor die 130 are not accessibly revealed by the insulating encapsulation 140.

In some embodiments, the insulating encapsulation 140 covers the redistribution circuit structure 118 exposed from the through vias 120, the semiconductor die 130, and the connecting material CM. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 6:
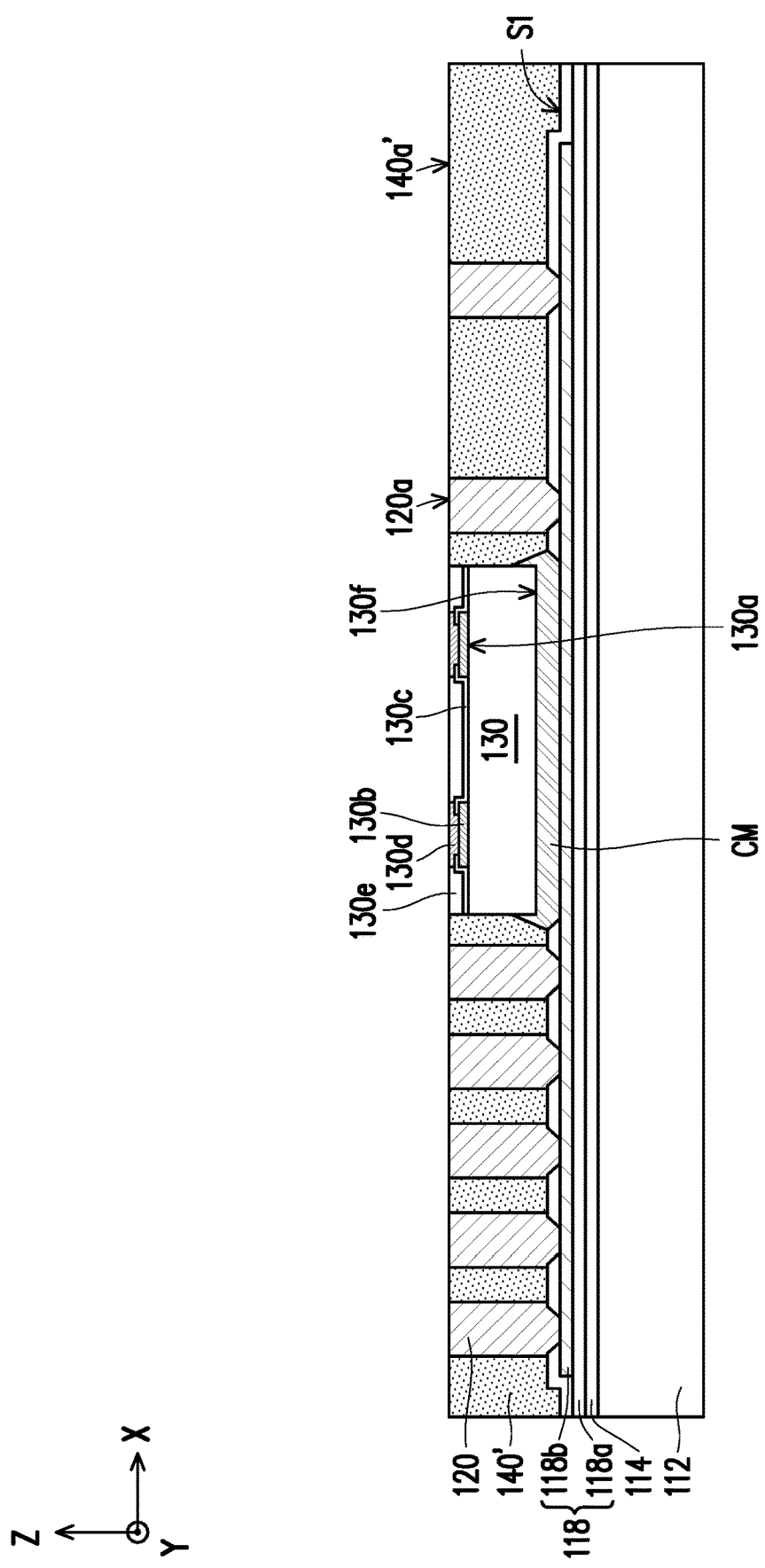

Referring to FIG. 6, in some embodiments, the insulating encapsulation 140 is planarized to form an insulating encapsulation 140' exposing the through vias 120 and the semiconductor die 130. In certain embodiments, as shown in FIG. 6, after the planarization, top surfaces 120a of the through vias 120 and top surfaces of the conductive pillars 130d and the protection layer 130e (of the semiconductor die 130) are exposed by a top surface 140a' of the insulating encapsulation 140'. That is, for example, the top surfaces of the conductive pillars 130d and the protection layer 130e of the semiconductor die 130 and the top surfaces 120a of the through vias 120 become substantially leveled with the top surface 140a' of the insulating encapsulation 140'. In other words, the top surfaces of the conductive pillars 130d and the protection layer 130e of the semiconductor die 130, the top surfaces 120a of the through vias 120, and the top surface 140a' of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of the semiconductor die 130 and the through vias 120 may also be planarized. In certain embodiments, the planarizing step may, for example, performed on the over-molded insulating encapsulation 140 to level the top surface 140a' of the insulating encapsulation 140', the top surfaces 120a of the through vias 120, and the top surfaces of the conductive pillars 130d and the protection layer 130e of the semiconductor die 130.

Figure 7:
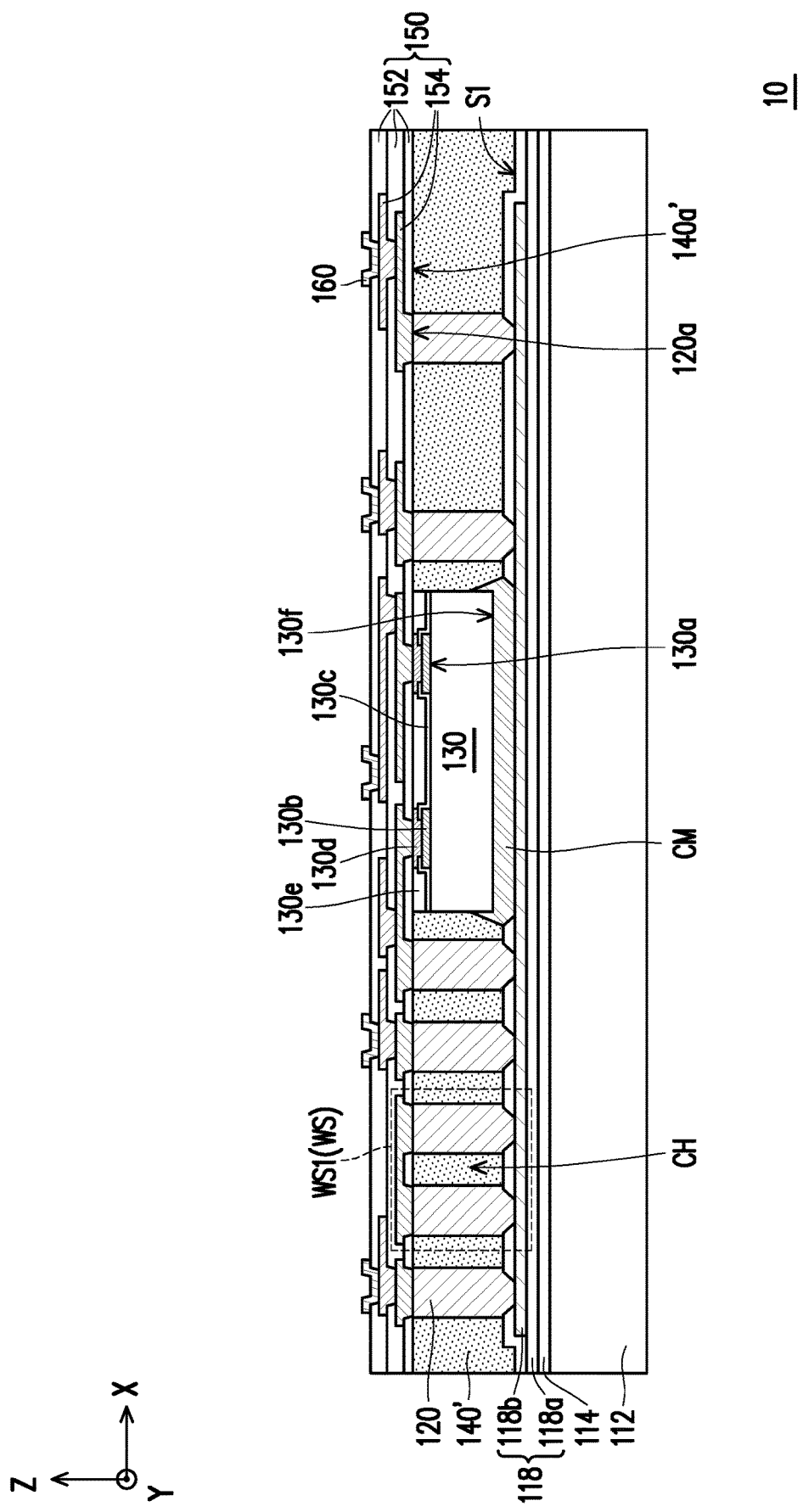

Referring to FIG. 7, in some embodiments, a redistribution circuit structure 150 is formed on the through vias 120, the semiconductor die 130 and the insulating encapsulation 140'. As shown in FIG. 7, the redistribution circuit structure 150 is formed on the top surfaces 120a of the through vias 120, the top surfaces of the conductive pillars 130d and the protection layer 130e of the semiconductor die 130, and the top surface 140a' of the insulating encapsulation 140'. In some embodiments, the redistribution circuit structure 150 is electrically connected to the through vias 120, and is electrically connected to the semiconductor die 130 through the conductive pillars 130d. In some embodiments, through the redistribution circuit structure 150, the semiconductor die 130 is electrically connected to the through vias 120. In some embodiments, through the redistribution circuit structure 150 and the through vias 120, the semiconductor die 130 is electrically connected to the redistribution circuit structure 118. As shown in FIG. 7, for example, the redistribution circuit structure 150 is referred to as a front-side redistribution layer of the semiconductor die 130. In some embodiments, as shown in FIG. 7, along a stacking direction (e.g. a direction Z), the semiconductor die 130 is directly located between the redistribution circuit structure 150 and the connecting material CM, where the through vias 120 and the insulating encapsulation 140' are directly located between the redistribution circuit structure 150 and the redistribution circuit structure 118.

In some embodiments, the formation of the redistribution circuit structure 150 includes sequentially forming one or more dielectric layers 152 and one or more metallization layers 154 in alternation. In certain embodiments, as shown in FIG. 7, the metallization layers 154 are sandwiched between the dielectric layers 152, where the top surface of a topmost layer of the metallization layers 154 is exposed by a topmost layer of the dielectric layers 152 and the bottom surface of a lowest layer of the metallization layers 154 is exposed by a lowest layer of the dielectric layers 152 to mechanically and electrically connect the through vias 120 and the conductive pillars 130d of the semiconductor die 130.

In some embodiments, the formation of the dielectric layers 152 may be the same as the formation of the dielectric layers 118a, and the formation of the metallization layers 154 may be the same as the formation of the metallization layer 118b, thus is not repeated herein. In an alternative embodiment, the material of the dielectric layers 152 may be the same as or different from the material of the dielectric layers 118a. In an alternative embodiment, the material of the metallization layers 154 may be the same as or different from the material of the metallization layer 118b. The disclosure is not limited thereto. It should be noted that the redistribution circuit structure 150 is not limited to include three dielectric layers and/or two metallization layers. For example, the numbers of the metallization layers and the dielectric layers may be one or more than one. As shown in FIG. 7, in some embodiments, the redistribution circuit structure 118, the through vias 120, and the redistribution circuit structure 150 provide a routing function for the semiconductor die 130.

In the disclosure, after the redistribution circuit structure 150 is formed, one or more waveguide structures WS are also formed in the package structure 10. In some embodiments, each waveguide structure WS may include a portion of the through vias 120, a portion of the metallization layer 118b, and a portion of the lowest layer of the metallization layers 154, where the portion of the metallization layer 118b and the portion of the lowest layer of the metallization layers 154 are respectively connected to two ends of each of the through vias 120 included in each waveguide structure WS, and each waveguide structure WS has a channel surrounded by the portion of the through vias 120, the portion of the metallization layer 118b, and the portion of the lowest layer of the metallization layers 154. The details of the waveguide structures WS will be described below in conjunction with FIG. 13 and FIG. 14, where the waveguide structures WS may include waveguide structures WS1-WS6, for example; however, the disclosure is not limited thereto. FIG. 13 is a schematic three-dimensional, partially enlarged perspective view illustrating the waveguide structures WS1 in FIG. 7, and where the schematic cross-sectional view of FIG. 7 is taken along the cross-sectional line I-I' depicted in FIG. 14.

Referring to FIG. 7, FIG. 13, and FIG. 14, in some embodiments, for the waveguide structure WS1, the portion of the metallization layer 118b are physically connected to one end of each of the through vias 120, and the portion of the lowest layer of the metallization layers 154 are physically connected to the other end of each of the through vias 120. As shown in FIG. 13, and FIG. 14, for example, the portion of the metallization layer 118b and the portion of the lowest layer of the metallization layers 154 are respectively located at two opposite sides of the through vias 120 along the direction Z, the through vias 120 are arranged into two rows along the direction X, and the two rows of the through vias 120 extend along the direction Y. In some embodiments, the two rows of the through vias 120 may be spaced apart from each other with a distance D1 ranging from about 5 mm to about 40 mm, and any two adjacent through vias 120 in each row may be spaced apart by a distance D2 ranging from about 200 μm to about 600 μm. In one embodiment, the distance D1 may change along the extending direction of the channel CH. In an alternative embodiment, the distance D1 may stay the same along the extending direction of the channel CH. In one embodiment, the distance D2 between any two adjacent through vias 120 arranged in the same row may change along the extending direction of the channel CH. In an alternative embodiment, the distance D2 between any two adjacent through vias 120 arranged in the same row may stay the same along the extending direction of the channel CH. As shown in FIG. 7, the through vias 120 of the waveguide structure WS1 are electrically connected to each other through the portion of the metallization layer 118b and the portion of the lowest layer of the metallization layers 154. The distance D1 is referred to as a width of the channels CH of the waveguide structures WS (e.g. the waveguide structures WS1-WS6), and the distance D2 is referred to as a pitch of the through vias 120 arranged in the same row.

In some embodiments, the through vias 120 of the waveguide structure WS1 are arranged into two rows (or columns) along one of the direction X and the direction Y, where the rows of the through vias 120 are extended along other one of the direction X and the direction Y, and a channel CH is located inside of the waveguide structure WS1 and extended along the other one of the direction X and the direction Y. In one embodiment, the direction X is different from the direction Y. In an alternative embodiment, the direction X is substantially perpendicular to the direction Y, however the disclosure is not limited thereto. For example, the through vias 120 arranged into the two rows along the direction X and extending along the direction Y, the portion of the metallization layer 118b and the portion of the lowest layer of the metallization layers 154 constitute the waveguide structure WS1, where the channel CH located inside of the waveguide structure WS1 is extended along the direction Y, as shown in FIG. 14. That is, for example, as shown in FIG. 7 and FIG. 14, the waveguide structure WS1 constituted by the portion of the through vias 120, the portion of the metallization layer 118b, and the portion of the lowest layer of the metallization layers 154 extends along the direction Y and has the channel CH in form of a linear line extending along the direction Y. However, the disclosure is not limited thereto. In one embodiment, as shown in FIG. 14, the portion of the through vias 120, the portion of the metallization layer 118b, and the portion of the lowest layer of the metallization layers 154 are arranged to constitute a waveguide structure WS3 extending along the direction X and having a channel CH in form of a linear line extending along the direction X.

In an alternative embodiment, the portion of the through vias 120, the portion of the metallization layer 118b, and the portion of the lowest layer of the metallization layers 154 may be arranged to constitute a waveguide structure extending along the direction X and the direction Y and having a channel CH in form of a line having one bending portion (e.g. a waveguide structure WS5 depicted in FIG. 14) or in form of a line having more than one bending portion (e.g. a waveguide structure WS6 depicted in FIG. 14). In other words, the channel CH of the waveguide structure WS5 and the channel CH of the waveguide structure WS6 are in form of a curved line extending along the direction X and the direction Y, for example. In other words, the waveguide structures WS in the disclosure may include the waveguide structures WS1-WS6 extending in one direction or more than one direction.

The number and size of the waveguide structures WS (e.g. the waveguide structures WS1-WS6) can be designated and selected based on the demand (e.g. the frequencies of antennas). In some embodiments, the number of the waveguide structures WS may be one or more than one, the disclosure is not limited thereto. In some embodiments, the number of the through vias 120 in each the waveguide structure WS is not limited to the disclosure. In one embodiment, the sizes of the waveguide structures WS in the package structure 10 may be the same. In an alternative embodiment, the sizes of the waveguide structures WS in the package structure 10 are different from each other. In a further alternative embodiment, the sizes of the waveguide structures WS in the package structure 10 may be partially the same and partially different. For example, as shown in FIG. 14, the waveguide structures WS1, WS4-WS6 have different sizes from the waveguide structures WS2-WS3, where the waveguide structure WS2 and the waveguide structure WS3 have the same size.

In some embodiments, a signal may be transmitted between each waveguide structure WS and the semiconductor die 130 by directly feeding. For example, through the redistribution circuit structure 118 and/or the redistribution circuit structure 150, a physical connection between the waveguide structure WS1 and the semiconductor die 130 presents to form an electrical connection there-between, as shown in FIG. 7. However, the disclosure is not limited thereto.

In an alternative embodiment, the signal may be transmitted between each waveguide structure WS and the semiconductor die 130 by electrical coupling. For example, the portion of the redistribution circuit structure 118 and the portion of the redistribution circuit structure 150 of the waveguide structure WS1 may be physically separating from the rest of the redistribution circuit structure 118 and the rest of the redistribution circuit structure 150 that are electrically connected to the semiconductor die 130, where the waveguide structure WS1 may be electrically coupled to the semiconductor die 130 through either electrically coupling the portion of the redistribution circuit structure 118 of the waveguide structure WS1 to the rest of the redistribution circuit structure 118 or electrically coupling the portion of the redistribution circuit structure 150 of the waveguide structure WS1 to the rest of the redistribution circuit structure 150.

For example, in the package structure 10, the signal transmitting from the semiconductor die 130 to later-formed elements (e.g. antennas depicted in FIG. 11) or transmitting from the later-formed elements to the semiconductor die 130 is transmitted inside the channel CH of each waveguide structure WS in a manner of an electromagnetic wave propagation. In other words, the signal in an electric signal mode (as generated from the semiconductor die 130) is transformed into an electromagnetic wave mode (as received by each waveguide structure WS), such that the signal, as being in the electromagnetic wave mode, is transmitted inside the channel CH of each waveguide structure WS along the extending direction of the channel CH. For example, a wavelength of the electromagnetic wave may fall within the wavelength range of microwave. In detail, the signal transmitted from the semiconductor die 130 to each waveguide structure WS is transformed from the electric signal mode into the electromagnetic wave mode as long as such waveguide structure WS is overlapped with a feed line (e.g. the redistribution circuit structure 118 or the redistribution circuit structure 150 electrically connected to the semiconductor die 130) while the impedance of each waveguide structure WS is matched to the impedance of a feed line (i.e. transmitting the signal generated from the semiconductor die 130) and a frequency of the feed line falls within a frequency range of each waveguide structure WS. Owing to the waveguide structures WS (e.g. the waveguide structures WS1-WS6), transmitting time of the signals inside the package structure 10 is shorten. For example, the signal generated from the semiconductor die 130 may be in a transverse electromagnetic (TEM) mode while the signal inside each waveguide structure WS may be in a transverse electric (TE) mode or a transverse magnetic (TM) mode.

Since the signal transmission are mostly transmitted in the form of electromagnetic wave (e.g. in high frequency transmission (for example, 40-70 GHz)), the waveguide structures WS (e.g. the waveguide structures WS1-WS6) can be further used as part of the thermal path of heat dissipation (e.g. in low frequency transmission) for the package structure 10 without affecting the signal transmission of the package structure 10. That is, owing to the waveguide structures WS, the thermal dissipation of the package structure 10 can be further enhanced.

In some embodiments, the through vias 120 located outside of and surrounding the waveguide structures WS may serve as electromagnetic interference shielding features for the waveguide structures WS, which can suppress the impact causing by electromagnetic wave generated from other elements located outside and/or inside of the package structure 10. Owing to such configuration, the electromagnetic interference to the package structure 10 is reduced, thereby enhancing reliability and performance of the package structure 10. In some embodiments, the through vias 120 located outside of the waveguide structures WS may serve as contacts for electrically grounded connection or power connection of the package structure 10. In some embodiments, the through vias 120 located outside of the waveguide structures WS is electrically connected to at least one of the redistribution circuit structure 118 and the redistribution circuit structure 150. For example, as shown in FIG. 7, the redistribution circuit structure 118 is electrically connected to the semiconductor die 130 through the through vias 120 located outside of the waveguide structures WS (e.g. the waveguide structure WS1) and the redistribution circuit structure 150.

Continued on FIG. 7, in some embodiments, a plurality of under-ball metallurgy (UBM) patterns 160 may be disposed on the exposed top surfaces of the topmost layer of the metallization layers 154 for electrically connecting with conductive elements (e.g. conductive balls or other additional semiconductor element (e.g., passive components or active components)). As shown in FIG. 7, for example, the UBM patterns 160 are formed on and electrically connected to the redistribution circuit structure 150. The materials of the UBM patterns 160 may include copper, nickel, titanium, tungsten, or alloys thereof or the like, and may be formed by an electroplating process, for example. The number of the UBM patterns 160 is not limited in this disclosure, and corresponds to the number of portions of the top surface of the topmost layer of the metallization layers 154 exposed by the topmost layer of the dielectric layers 152.

Figure 8:
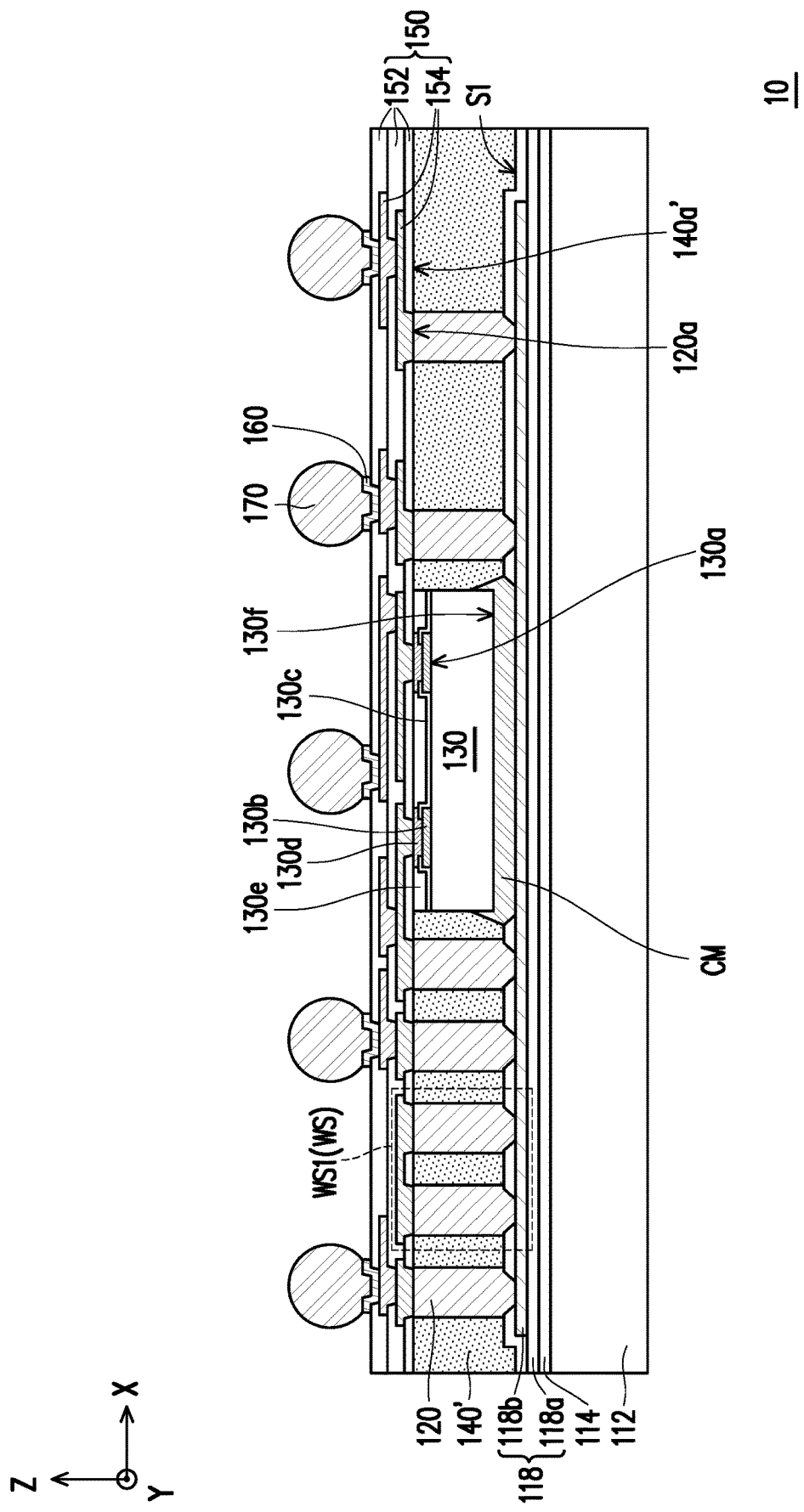

Referring to FIG. 8, in some embodiments, after the redistribution circuit structure 150 is formed, a plurality of conductive elements 170 are formed on the redistribution circuit structure 150. As shown in FIG. 8, the conductive elements 170 are disposed on the UBM patterns 160 over the redistribution circuit structure 150, for example. In some embodiments, the conductive elements 170 may be disposed on the UBM patterns 160 by ball placement process or reflow process. In some embodiments, the conductive elements 170 are, for example, solder balls or ball grid array (BGA) balls. In some embodiments, the conductive elements 170 are connected to the redistribution circuit structure 150 through the UBM patterns 160. As shown in FIG. 8, some of the conductive elements 170 are electrically connected to the semiconductor die 130 through the UBM patterns 160 and the redistribution circuit structure 150, some of the conductive elements 170 are electrically connected to the through vias 120 through the UBM patterns 160 and the redistribution circuit structure 150, and some of the conductive elements 170 are electrically connected to the redistribution circuit structure 118 through the UBM patterns 160, the redistribution circuit structure 150 and the through vias 120. The number of the conductive elements 170 is not limited to the disclosure, and may be designated and selected based on the number of the UBM patterns 160.

In some embodiments, some of the conductive elements 170 are connected to the waveguide structures WS through the redistribution circuit structure 150 and the UBM patterns 160. With such configuration, the redistribution circuit structure 118, the waveguide structures WS (e.g. the waveguide structures WS1-WS6), the redistribution circuit structure 150, the UBM patterns 160 and the respective conductive elements 170, which are connected to each other, are considered as the thermal path of heat dissipation for the package structure 10. However, the disclosure is not limited thereto. In some alternative embodiments, the UBM patterns 160 may be omitted. For example, the conductive elements 170 may directly connected to the redistribution circuit structure 150. In other words, the waveguide structures WS may directly connected to the conductive elements 170 through the redistribution circuit structure 150. In some embodiments, positioning locations of the waveguide structures WS are not overlapped with positioning locations of the conductive elements 170 along the stacking direction (e.g. the direction Z) of the redistribution circuit structures 118 and the redistribution circuit structure 150. In other words, along the stacking direction (e.g. the direction Z) of the redistribution circuit structures 118 and the redistribution circuit structure 150, the positioning locations of the waveguide structures WS are aside of the positioning locations of the conductive elements 170, for example.

In some alternative embodiments, at least one additional semiconductor device may be optionally provided, and may be disposed on and electrically connected to the redistribution circuit structure 150 through the UBM pattern 160. In some embodiments, the additional semiconductor device may be disposed on the UBM pattern 160 through reflow process. For example, the conductive elements 170 and the additional semiconductor device may be formed on a surface of the redistribution circuit structure 150, where the redistribution circuit structure 150 is located between the insulating encapsulation 140' and the conductive elements 170 and between the insulating encapsulation 140' and the additional semiconductor device. The additional semiconductor device may, for example, include a surface mount device (e.g. a passive device, such as, capacitors, resistors, inductors, combinations thereof, or the like). In one embodiment, the additional semiconductor device may include surface mount devices of the same type or different types, the disclosure is not limited thereto. The number of the additional semiconductor device can be selected based on the demand.

Figure 9:
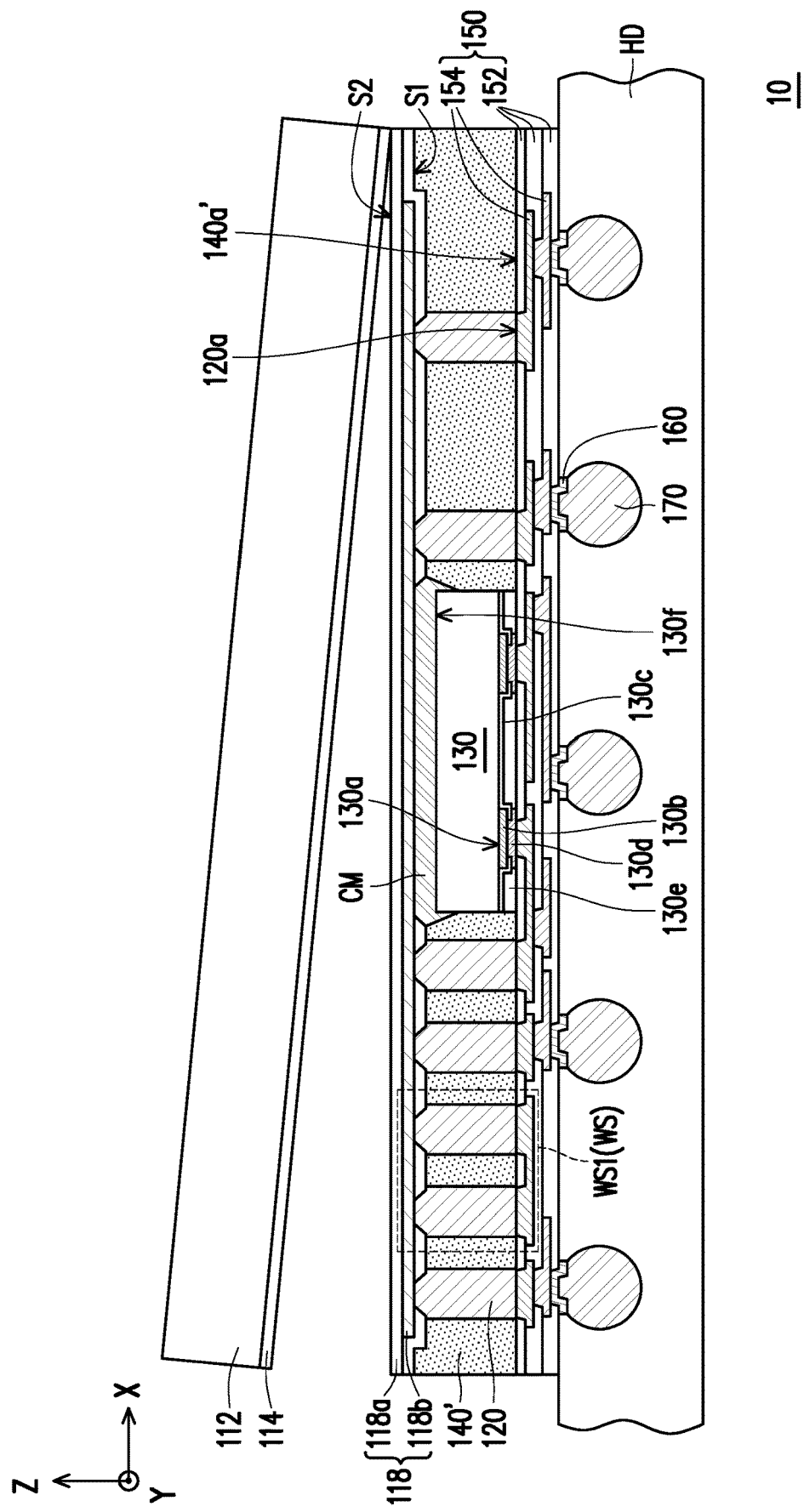

Referring to FIG. 9, in some embodiments, the whole package structure 10 along with the carrier 112 is flipped (turned upside down), where the conductive elements 170 are placed to a holding device HD, and the carrier 112 is then debonded from the redistribution circuit structure 118. In some embodiments, the holding device HD includes a polymer film, and the conductive elements 170 are mounted into the polymer film as shown in FIG. 9. For example, the material of the polymer film may include a polymer film having sufficient elasticity to allow the conductive elements 170 being embedded therein. In certain embodiments, the holding device HD may be a parafilm or a film made of other suitable soft polymer materials or the like. In an alternative embodiment, the holding device HD may be an adhesive tape, a carrier film or a suction pad. The disclosure is not limited thereto.

In some embodiments, the redistribution circuit structure 118 is easily separated from the carrier 112 due to the debond layer 114. In some embodiments, the carrier 112 is detached from the redistribution circuit structure 118 through a debonding process, and the carrier 112 and the debond layer 114 are removed. In certain embodiments, a second side S2 of the redistribution circuit structure 118 is exposed, as show in FIG. 9. In one embodiment, the debonding process is a laser debonding process. During the debonding step, the holding device HD is used to secure the package structures 10 before debonding the carrier 112 and the debond layer 114. In an alternative embodiment, the buffer layer on the debond layer 114 may be removed from the redistribution circuit structure 118 after debonding the carrier 112 and the debond layer 114.

Figure 10:
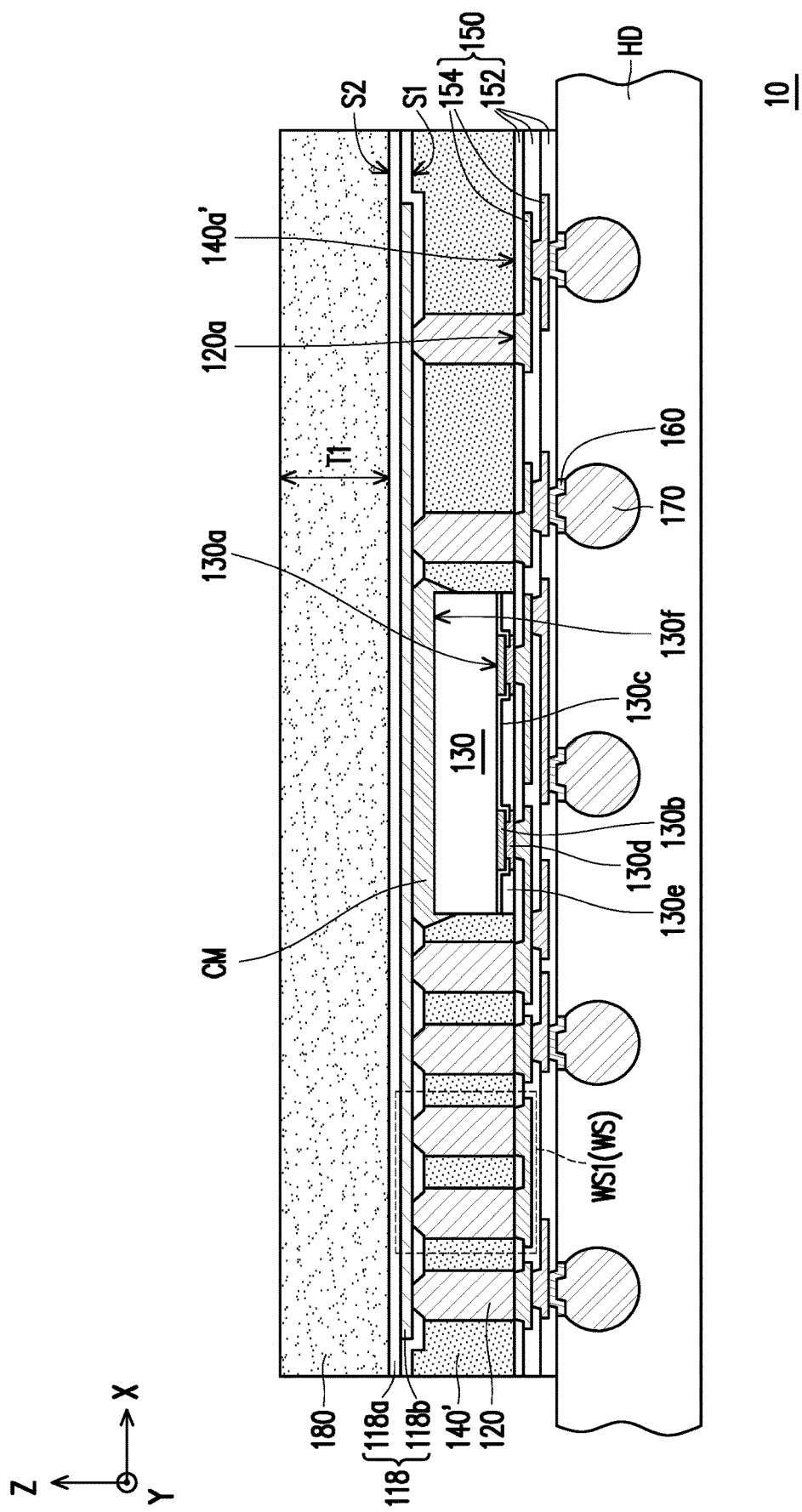

Referring to FIG. 10, in some embodiments, an encapsulant 180 is formed on the redistribution circuit structure 118 (e.g. the second side S2 of the redistribution circuit structure 118), where the encapsulant 180 covers the metallization layer 118b in a blanket manner. For example, as shown in FIG. 10, the redistribution circuit structure 118 is sandwiched between the encapsulant 180 and the insulating encapsulation 140'. In some embodiments, the encapsulant 180 may be a lamination film laminated onto the redistribution circuit structure 118, may be dispensed/coated as a liquid and cured, or may be the like; the disclosure is not limited thereto.

In some embodiments, the encapsulant 180 includes epoxy resins or any other suitable type of molding materials. In some embodiments, the material of the encapsulant 180 has low permittivity (Dk) and low loss tangent (Df) properties. Depending on the frequency range of the high-speed applications, suitable materials of the encapsulant may be selected based on the required electrical properties of the package. In some embodiments, the material of the encapsulant 180 can be the same as the material of the insulating encapsulation 140/140'. In an alternative embodiment, the material of the encapsulant 180 can be different from the material of the insulating encapsulation 140/140', the disclosure is not limited thereto. In some embodiments, a thickness T1 of the encapsulant 180 ranges from about 50 μm to about 500 μm.

Figure 11:
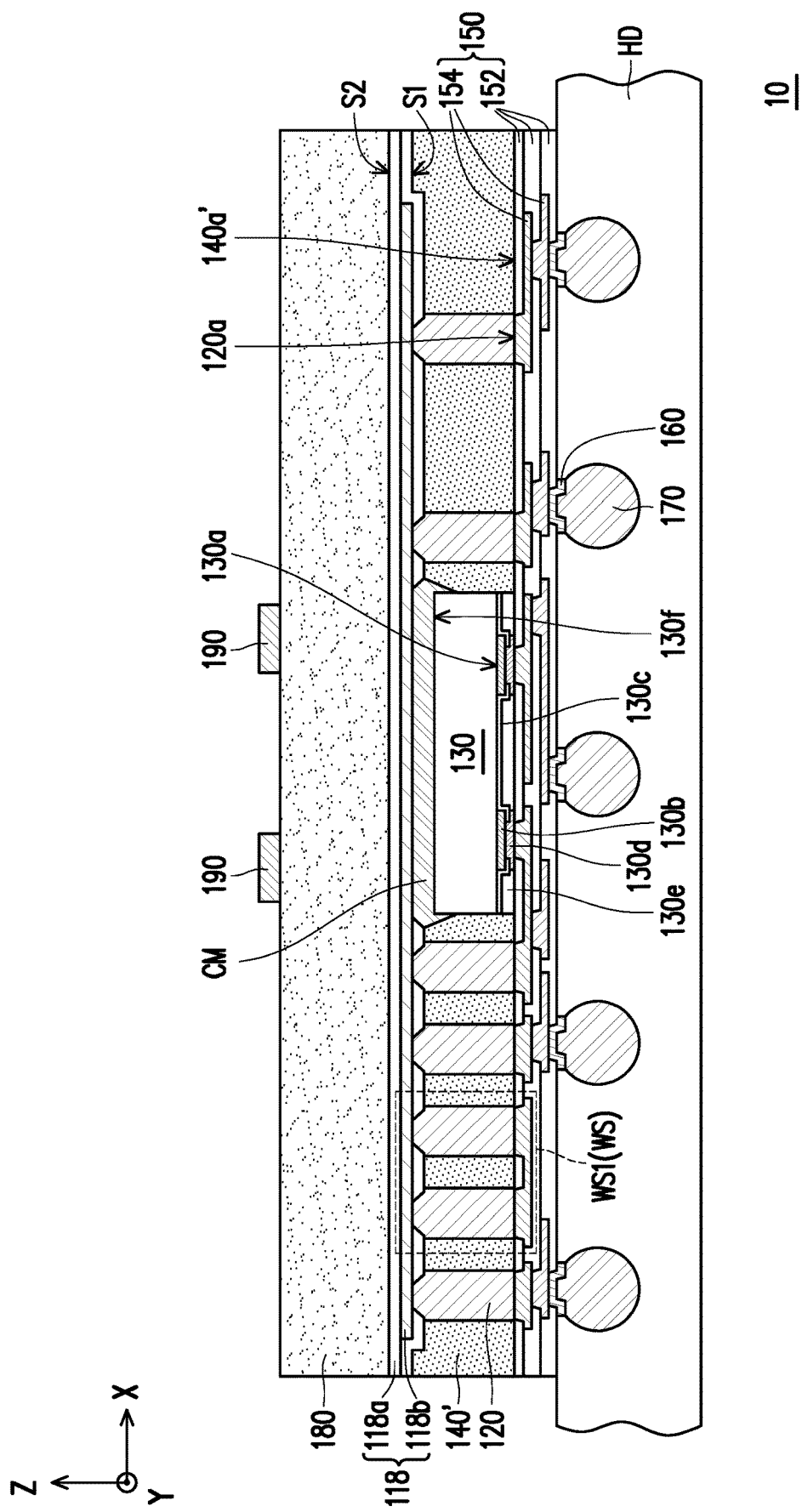

Referring to FIG. 11, in some embodiments, one or more antennas 190 are formed on the encapsulant 180 and over the redistribution circuit structure 118 (e.g. the metallization layer 118b). For example, a plurality of the antenna 190 are formed on the encapsulant 180, where the encapsulant 180 is located between the antennas 190 and the redistribution circuit structure 118. The number of the antennas 190 is not specifically limited in the disclosure.

As shown in FIG. 11, in some embodiments, the antennas 190 are formed on a surface of the encapsulant 180 facing away from the second side S2 of the redistribution circuit structure 118. In some embodiments, the antennas 190 are electrically coupled with the metallization layer 118b of the redistribution circuit structure 118, where the metallization layer 118b overlapped with the antennas 190 serves as a ground plate and a feed-line for the antennas 190. For example, a portion of the metallization layer 118b overlapped with the antennas 190 is referred to as the ground plate while another portion of the metallization layer 118b connecting to the portion of the metallization layer 118b (electrically isolated to the ground plate) overlapped with the antennas 190 is referred to as the feed-line of the antennas 190 for transmitting signals from the semiconductor die 130 to the antennas 190 or from antennas 190 to the semiconductor die 130. In the disclosure, the antennas 190 and the corresponding portions of the metallization layer 118b works together for antenna application. In other words, the antennas 190 are electrically communicated to the semiconductor die 130 by electrically coupling to the redistribution circuit structure 118 (e.g. the metallization layer 118b serves as the ground plate/feed line). For example, the signal generated from the semiconductor die 130 may be transmitted to the redistribution circuit structure 118 through the through vias 120 located outside of the waveguide structures WS and the redistribution circuit structure 150 connected thereto or through the waveguide structures WS in a manner of directly feeding or electrically coupling. Besides, the signal transmitted to the redistribution circuit structure 118 (e.g. the metallization layer 118b serves as the ground plate/feed line) from the antennas 190 may be transmitted to the semiconductor die 130 through the through vias 120 located outside of the waveguide structures WS and the redistribution circuit structure 150 connected thereto or through the waveguide structures WS in a manner of directly feeding or electrically coupling, for example.

In some embodiments, the antennas 190 are arranged in form of a matrix, such as the N×N array or N×M arrays (N, M>0, N may or may not be equal to M). As shown in FIG. 11 and FIG. 14, in some embodiments, the package structure 10 includes the antennas 190 arranged in form of an array, such as a 2×2 array, however, the disclosure is not limited thereto. The size of the array for antennas 190 can be designated and selected based on the demand. In some embodiments, the antennas 190 are located on and overlapped with the metallization layer 118b, the connecting material CM, and the semiconductor die 130. In some embodiments, the antennas 190 may include patch antennas. In some embodiments, the antennas 190 are the patch antennas of the same type (e.g. one frequency). For example, as shown in FIG. 14, the antenna 190 includes a plurality of antennas 190a~190d arranged in a 2×2 array, where the antenna 190a~190d are the patch antennas having the same frequency transmission, however the disclosure is not limited thereto. In an alternative embodiment, the antennas 190 may be the patch antennas of different types (e.g. various frequencies). In some embodiments, as shown in FIG. 14, on a X-Y plane, a size of each antenna 190 may be a length L1×a length L2, where L1 and L2 are independently ranging from about (⅓)λ to about (½)λ, λ is a wavelength corresponding to the frequency of each antenna 190, and the frequency is chosen depending on the demand and the design layout and is not limited in the disclosure.

In some embodiments, the antennas 190 are formed by forming a metallization layer (not shown) by electroplating or deposition over the encapsulant 180 and then patterning the metallization layer by photolithographic and etching processes. In an alternative embodiment, the antennas 190 are formed by forming a metallization layer (not shown) by plating process. In a further alternative embodiment, the antennas 190 are formed by forming a metallization layer (not shown) by lamination or the like. In some embodiments, the material of the antennas 190 includes aluminum, titanium, copper, nickel, tungsten, and/or alloys thereof.

Figure 12:
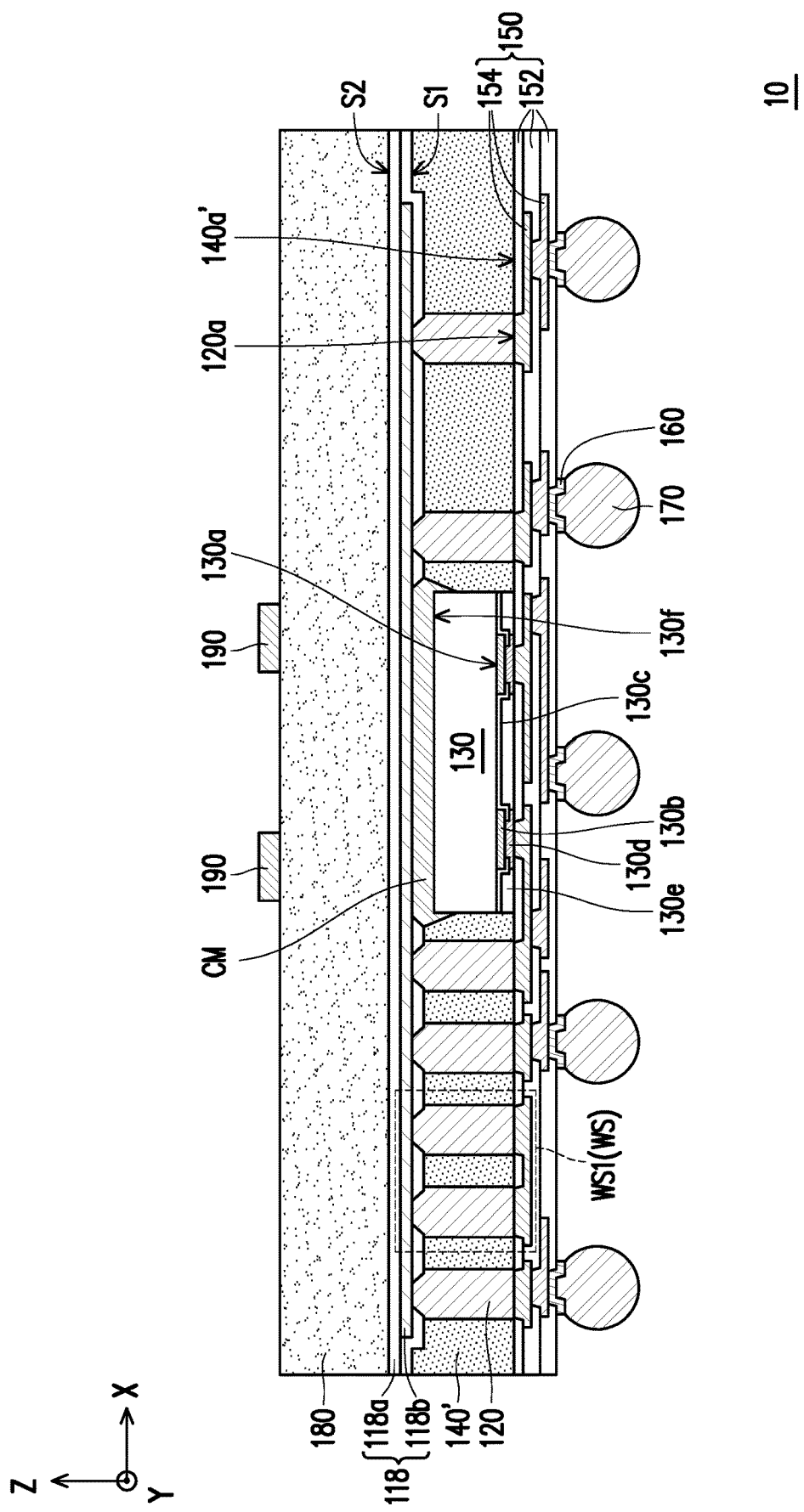

Referring to FIG. 12, in some embodiments, the conductive elements 170 are released from the holding device HD to form the package structure 10, and the redistribution circuit structure 150 and the conductive elements 170 are exposed. In some embodiments, a dicing process is performed to cut the wafer having a plurality of the package structures 10 into individual and separated package structures 10 before releasing the conductive elements 170 from the holding device HD. In one embodiment, the dicing process is a wafer dicing process including mechanical blade sawing or laser cutting. Up to here, the manufacture of the package structure 10 is completed.

In some embodiments, the package structure 10 may be further mounted with an additional package, chips/dies or other electronic devices to form a stacked package structure. For example, the package structure 10 may be further mounted with an additional package, chips/dies or other electronic devices to form the POP structure through the conductive elements 170 and/or other additional connectors based on the demand.

In an alternative embodiment, the package structure 10 further includes one or more dipole antennas DA. In some embodiments, each of the dipole antennas DA is constituted by two of the through vias 120 located aside of the semiconductor die 130 and encapsulated in the insulating encapsulation 140' and corresponding portions of the redistribution circuit structure 118 and/or the redistribution circuit structure 150 electrically connected to the two through vias 120. The through vias 120 are arranged along the edges of the package structure 10, as shown in FIG. 14, for example. In one embodiment, for the two through vias 120 of each dipole antenna DA, one through via 120 is electrically connected to a part of the redistribution circuit structure 118 or a part of the redistribution circuit structure 150 (one of which serves as a feed line of each dipole antenna DA); and the other through via 120 is electrically connected to the other one of the part of the redistribution circuit structure 118 or the part of the redistribution circuit structure 150 (one of which serves as a ground plate/line of each dipole antenna DA) or is electrically connected to one of another part of the redistribution circuit structure 118 and another part of the redistribution circuit structure 150 (as a ground plate/line of each dipole antenna DA). Similar to the antennas 190, through the waveguide structure WS (e.g. the waveguide structures WS1-WS6), the dipole antennas DA may also transmit signals to the semiconductor die 130 or receive the signals from the semiconductor 130. In other words, the dipole antennas DA are electrically connected to the semiconductor die 130 through the waveguide structures WS (including the through vias 120, the redistribution circuit structure 118, and the redistribution circuit structure 150). For example, the dipole antennas DA may be electrically communicated to the semiconductor die 130 through the through vias 120 outside of the waveguide structures WS along with the redistribution circuit structure 118 and/or the redistribution circuit structure 150 or through the waveguide structures WS in a manner of directly feeding or electrically coupling. The disclosure is not limited thereto.

For example, the dipole antennas DA are referred as end-fire radiation antennas of horizontal polarization (e.g. the electromagnetic wave emitted by the end-fire radiation antennas polarizing in a direction X or a direction Y) or vertical polarization (e.g. the electromagnetic wave emitted by the end-fire radiation antennas polarizing in a direction Z). In some embodiments, the dipole antennas DA include a plurality of dipole antennas of horizontal polarization, vertical polarization, or a combination thereof. The disclosure is not limited thereto. The arrangement and numbers of the dipole antennas DA may be adjusted by the demand, the disclosure is not specifically limited. Furthermore, owing to the configuration of the antennas 190 and the dipole antennas DA, a coverage range of the electromagnetic waves in the package structure 10 is increased, and thus the efficiency of the antenna application of the package structure 10 is further enhanced.

Figure 15:
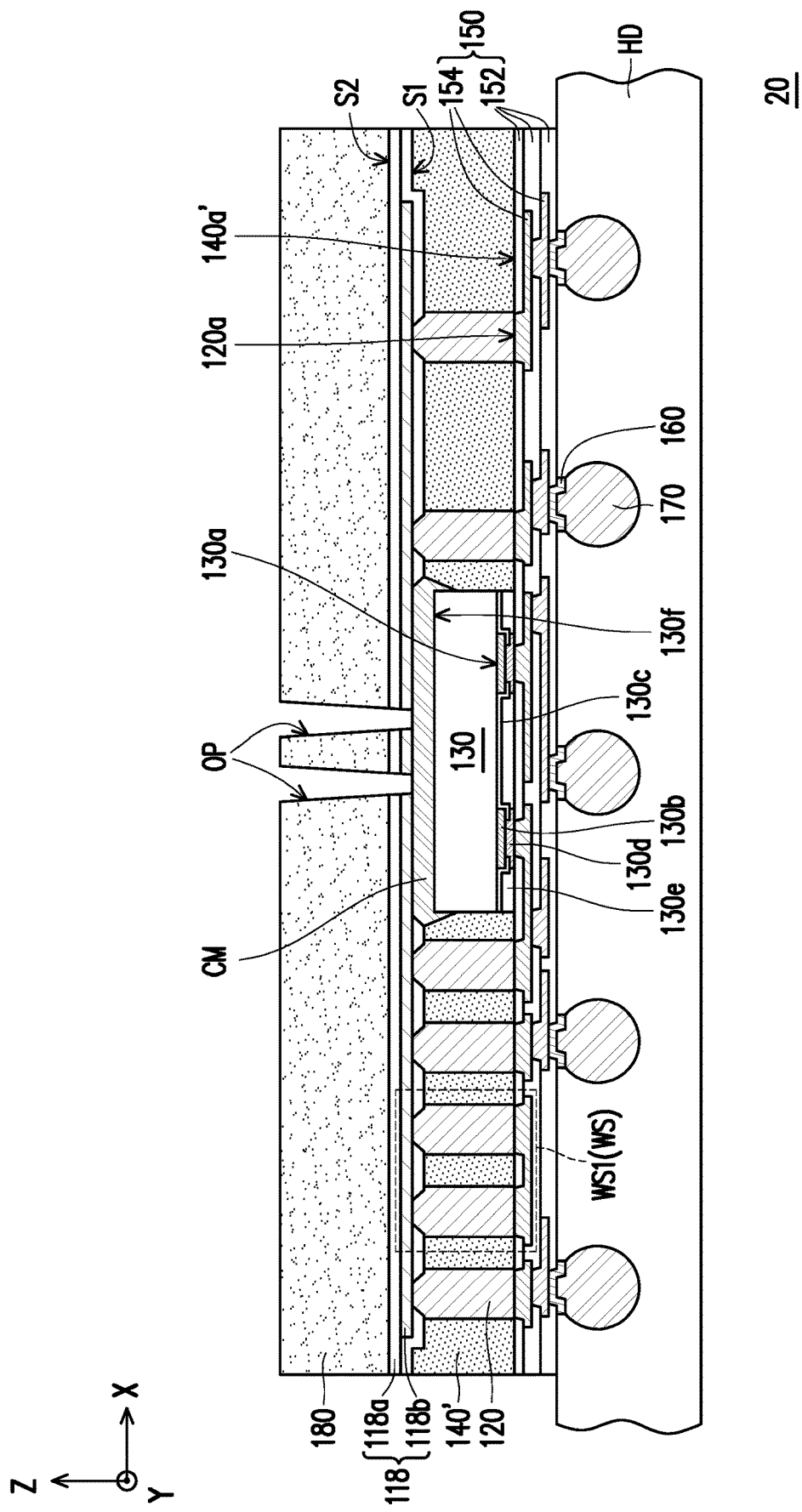
FIG. 15 to FIG. 17 are schematic cross-sectional views of various stages in a manufacturing method of a package structure according to some exemplary embodiments of the disclosure.
Figure 16:
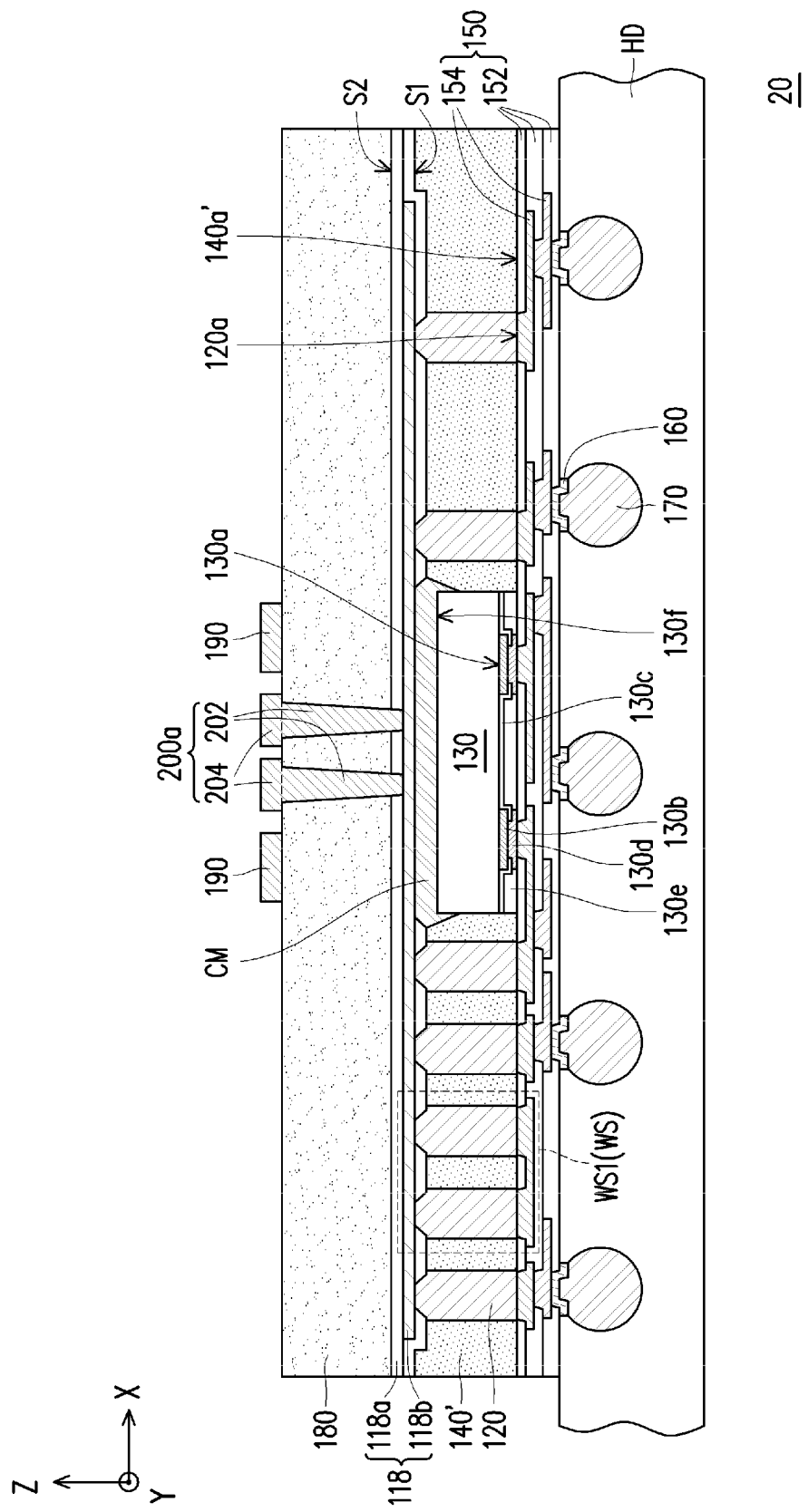
Figure 17:
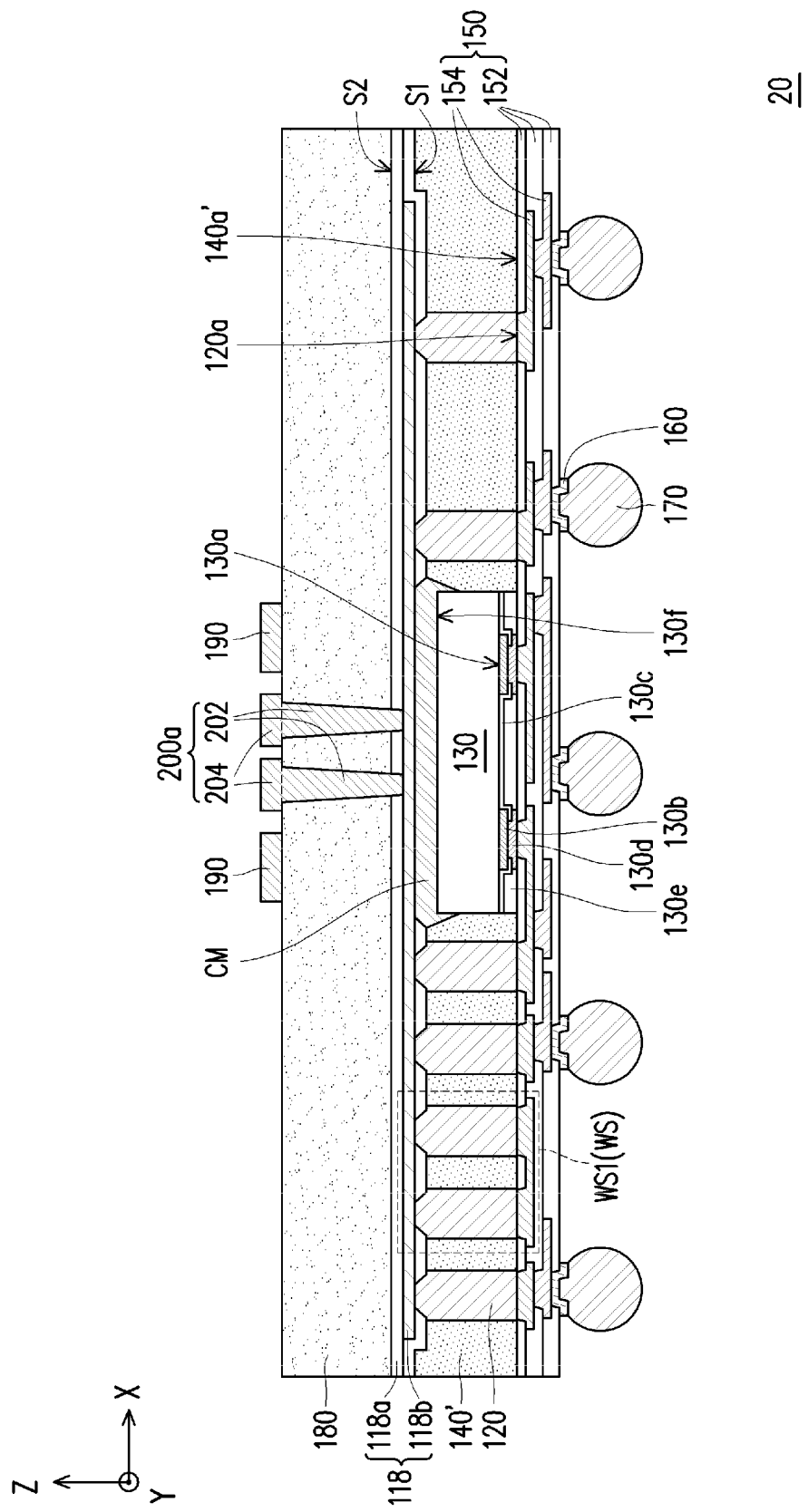
Figure 18:
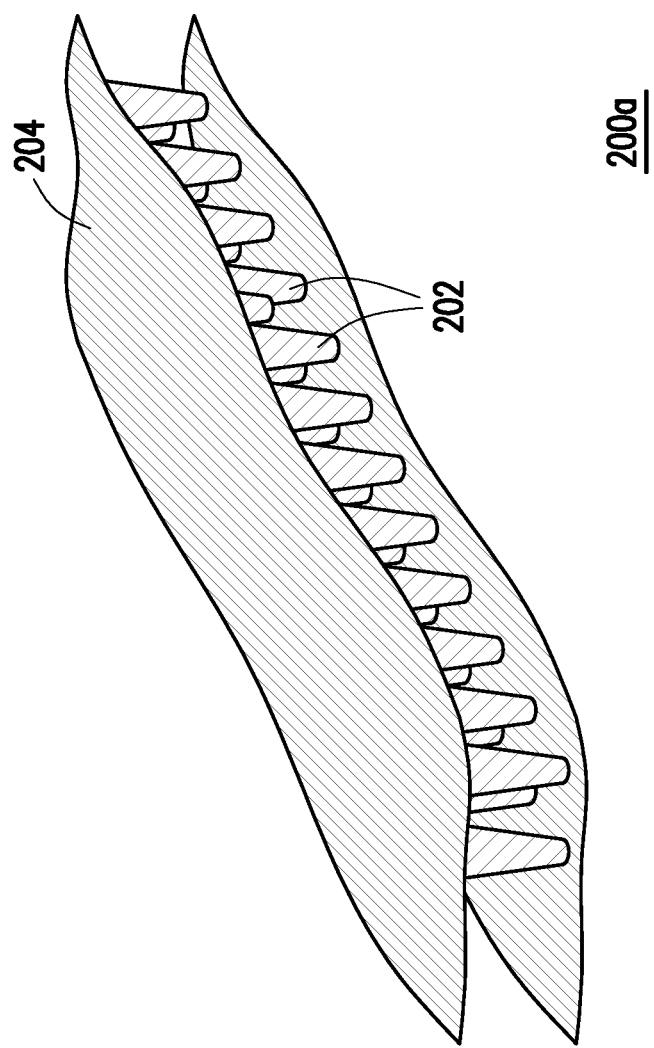
FIG. 18 is a schematic three-dimensional, partially enlarged perspective view of an isolation structure in a package structure according to some exemplary embodiments of the disclosure.
Figure 19:
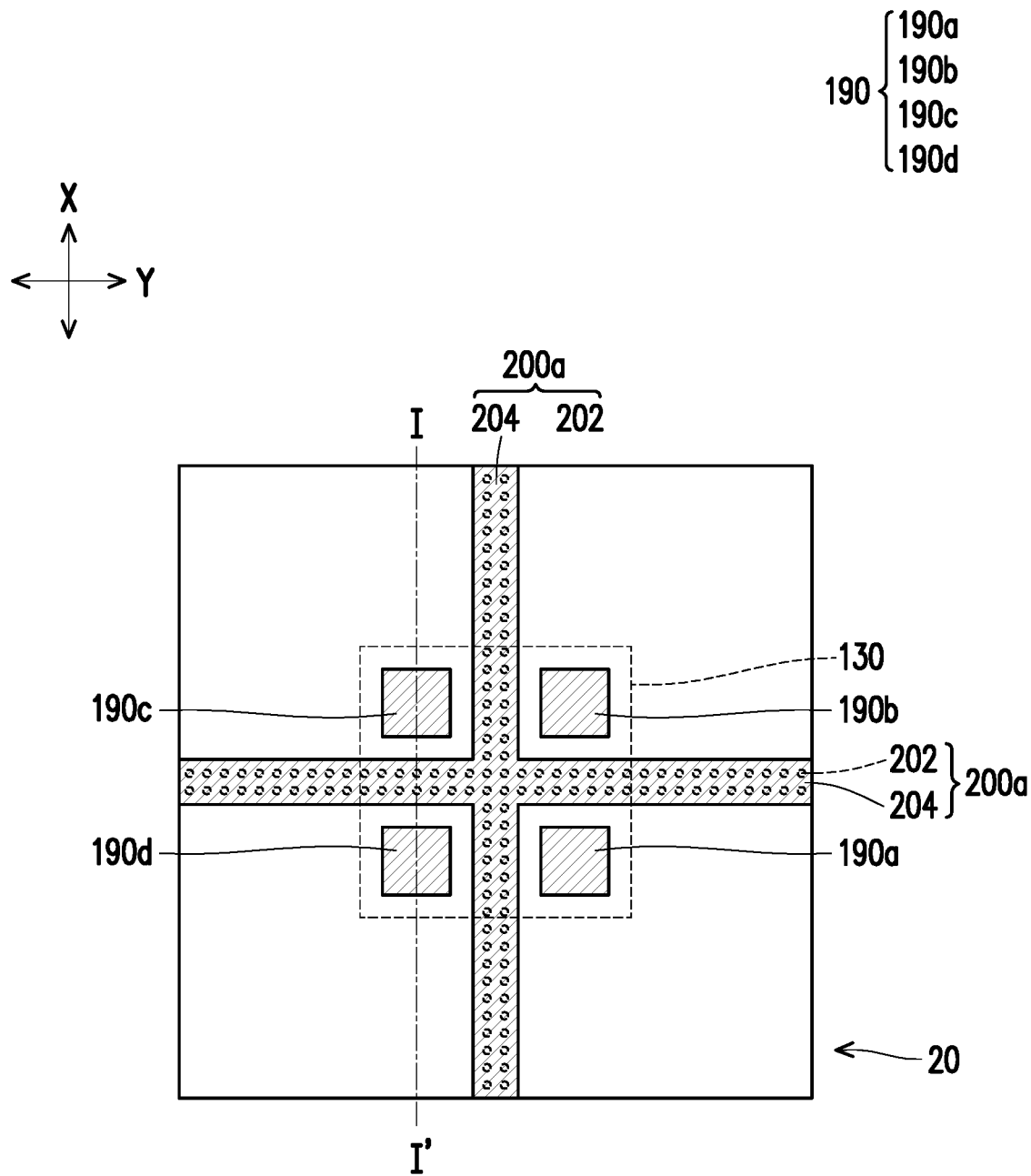
FIG. 19 is a schematic top view illustrating a relative position between antennas, isolation structures and a semiconductor die of a package structure according to some exemplary embodiments of the disclosure.
Figure 20:
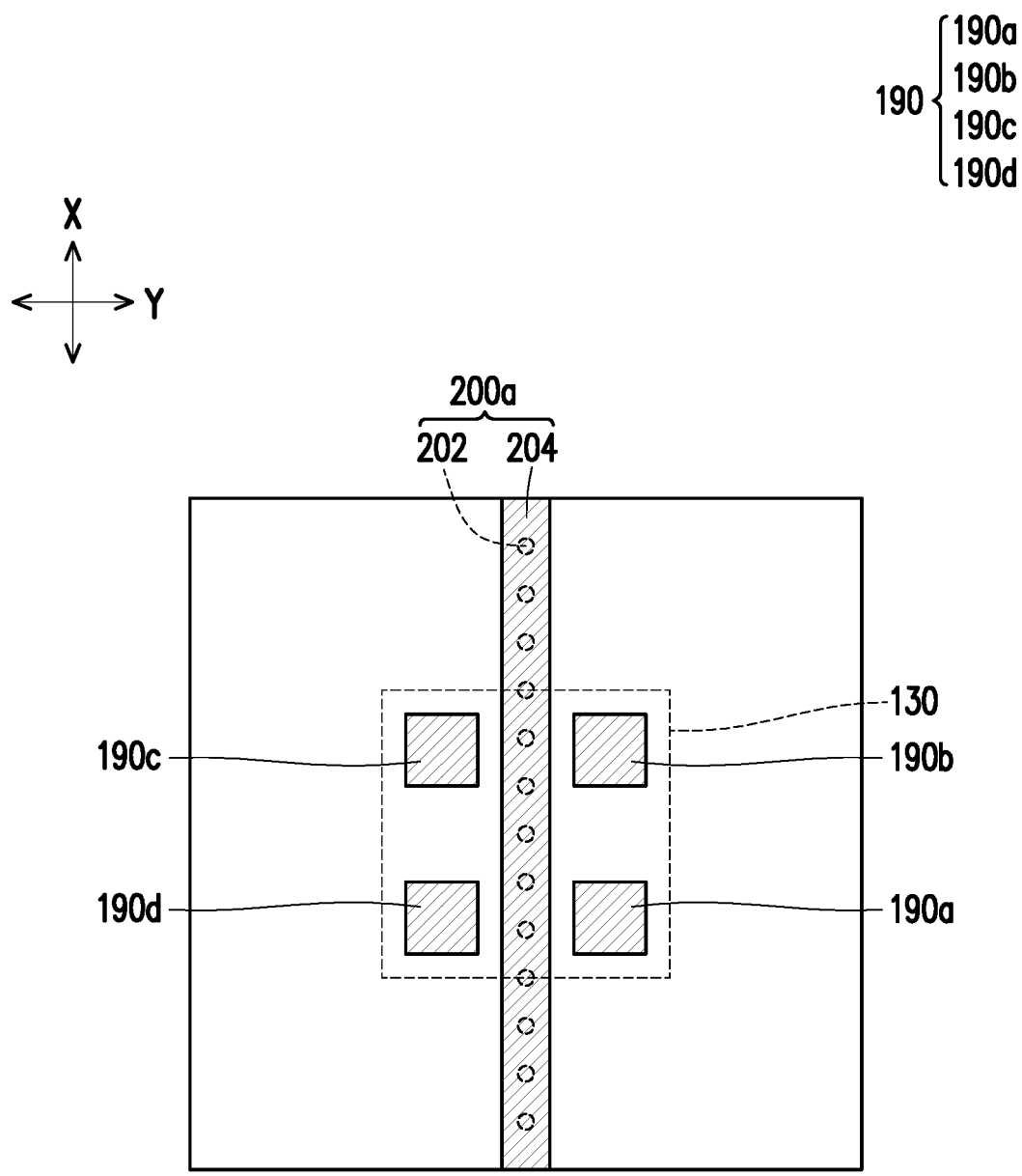
FIG. 20, FIG. 21, FIG. 22, and FIG. 23 are schematic top views illustrating various modifications of a relative position between antennas, isolation structures and a semiconductor die of a package structure according to some exemplary embodiments of the disclosure.
Figure 21:
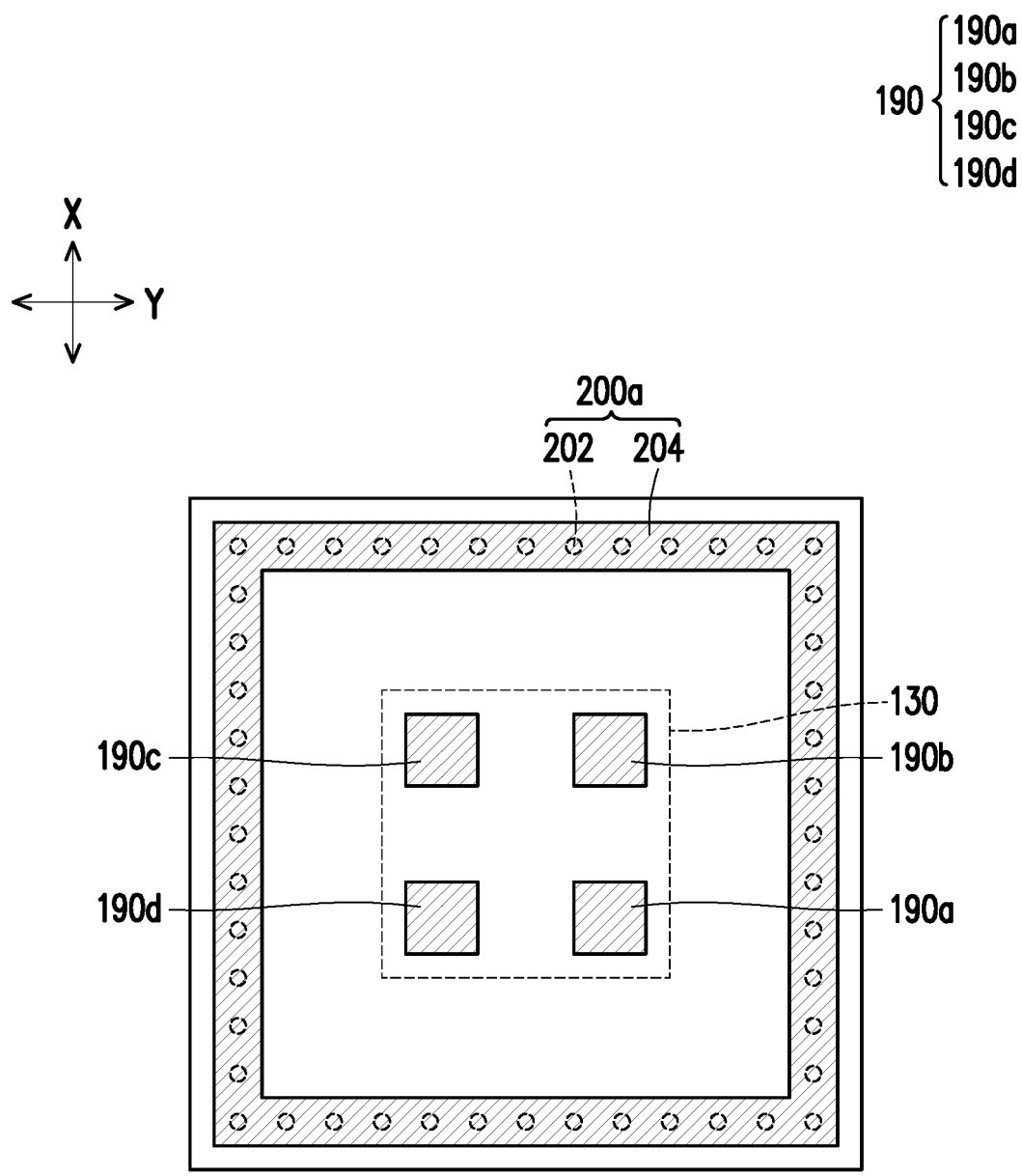
Figure 22:
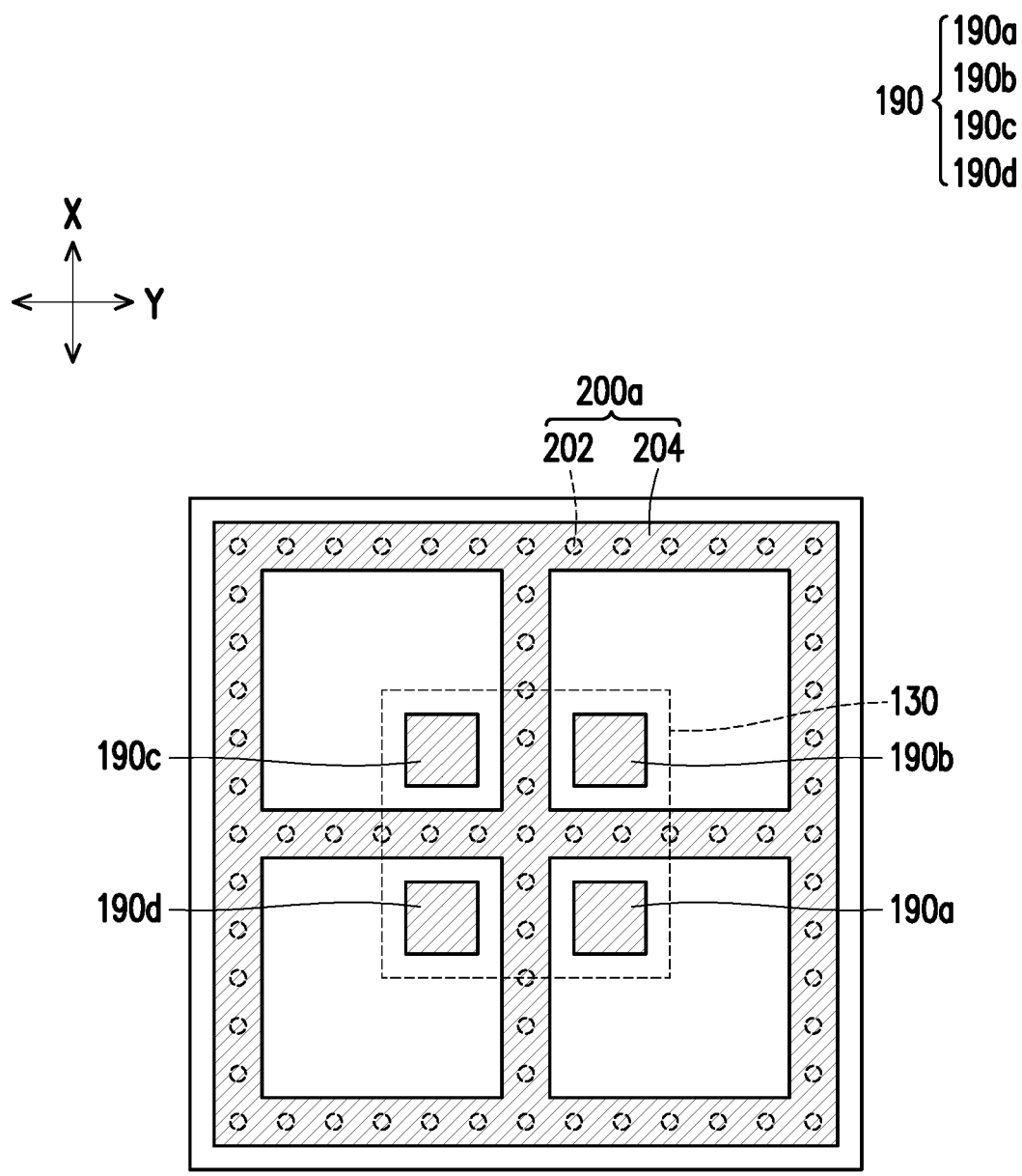
Figure 23:
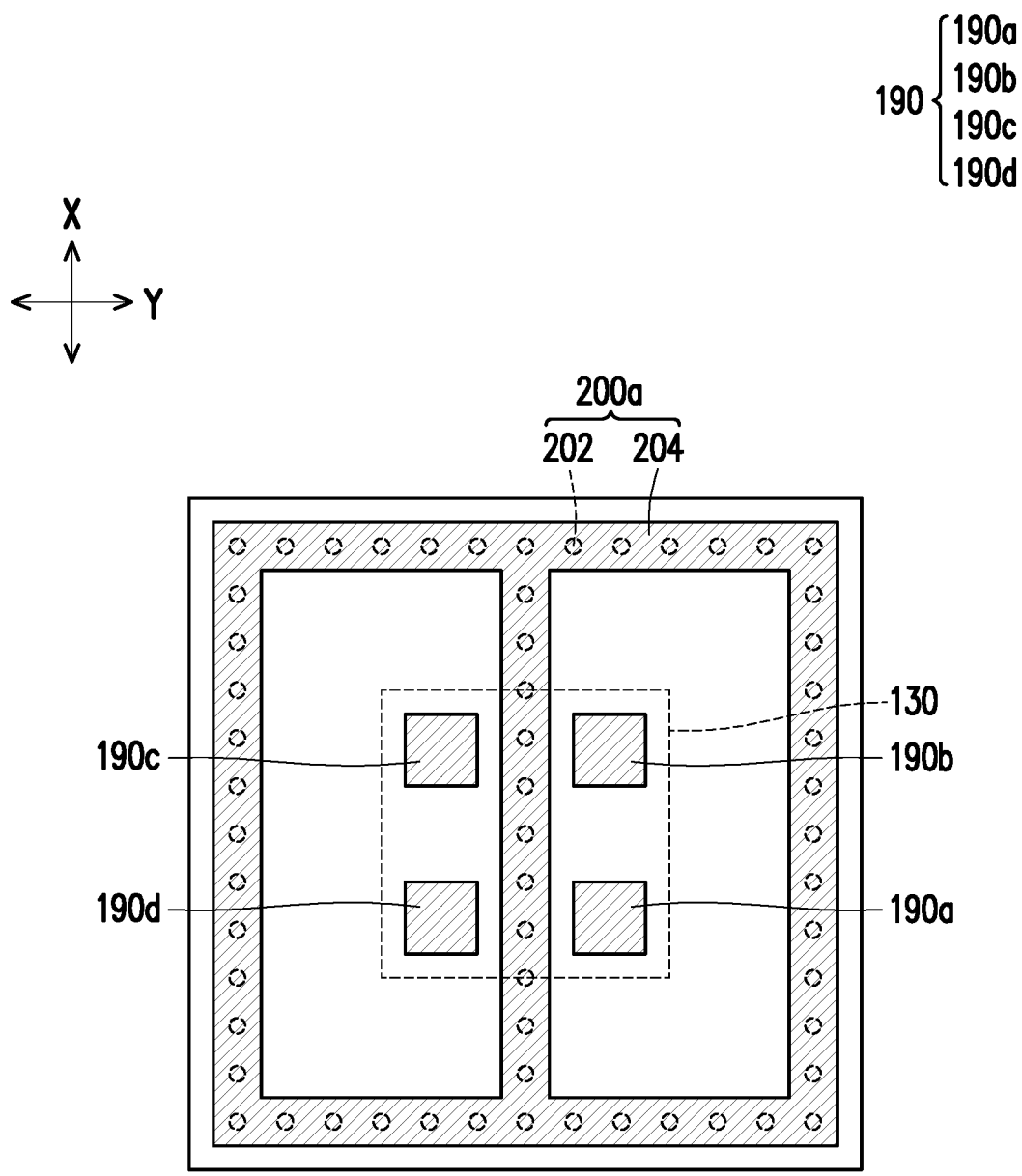

FIG. 15 to FIG. 17 are schematic cross-sectional views of various stages in a manufacturing method of a package structure according to some exemplary embodiments of the disclosure. FIG. 18 is a schematic three-dimensional, partially enlarged perspective view of an isolation structure in a package structure according to some exemplary embodiments of the disclosure. FIG. 19 is a schematic top view illustrating a relative position between antennas, isolation structures and a semiconductor die of a package structure according to some exemplary embodiments of the disclosure. FIG. 20, FIG. 21, FIG. 22, and FIG. 23 are schematic top views illustrating various modifications of a relative position between antennas, isolation structures and a semiconductor die of a package structure according to some exemplary embodiments of the disclosure.

FIG. 15 to FIG. 17 are the schematic cross-sectional views taken along the cross-sectional line I-I' depicted in FIG. 19, and the package structure 20 depicted in FIG. 15 to FIG. 17 and the package structure 10 depicted in FIG. 1 to FIG. 12 are similar; such that the elements similar to or substantially the same as the elements described above will use the same reference numbers, and certain details or descriptions of the same elements and the relationship thereof (e.g. the relative positioning configuration and electrical connection) will not be repeated herein. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Referring to FIG. 15, in some embodiments, a plurality of openings OP are formed in the encapsulant 180 and over the insulating encapsulation 140', following the process as described in FIG. 10. In some embodiments, the openings OP penetrate through the encapsulant 180 and the lowest layer of the dielectric layers 118a (depicted in FIG. 8, e.g. near the second side of the redistribution circuit structure 118) so as to expose portions of the metallization layer 180b. For example, in FIG. 15, only two openings OP are shown for illustration purpose, however the disclosure is not limited thereto. The number of the openings OP may be one or more than one depending on the demand.

In some embodiments, viewing from the top views (e.g. the X-Y plane), the openings OP are located aside of and surround the antennas 190, as shown in FIG. 15. In one embodiment, the openings OP may be overlapped with the semiconductor die 130; however, the disclosure is not limited thereto. In an alternative embodiment, the openings OP may not be overlapped with the semiconductor die 130. In an alternative embodiment, a portion of the openings OP may be overlapped with the semiconductor die 130, and the rest of the openings OP may not be overlapped with the semiconductor die 130.

In some embodiments, the openings OP may be formed by a laser drilling process. For example, the formation of the openings OP includes removing portions of the insulating encapsulation 140' and the lowest layer of the dielectric layer 180a (depicted in FIG. 8) to partially expose the metallization layer 118b. In some embodiments, if considering the openings OP is a hole with substantially round-shaped cross-section viewing from the X-Y plane, each of the openings OP includes a slant sidewall (along the direction Z), where each of the openings OP has a top opening having a top diameter and a bottom opening having a bottom diameter, and the top diameter is greater than the bottom diameter. For example, in FIG. 15, for each opening OP, the top opening having the top diameter is located at a surface of the encapsulant 180 facing away from the redistribution circuit structure 118 and the bottom opening having the bottom diameter is located at a surface of the encapsulant 180 facing to the redistribution circuit structure 118. However, viewing from the X-Y plane, the cross-sectional shape of the openings OP is not limited to be round and may be elliptical, oval, tetragonal, octagonal or any suitable polygonal shape.

Referring to FIG. 16, in some embodiments, the antennas 190 and at least one isolation structure 200a are formed. The formation and material of the antennas 190 are described in FIG. 11, and thus are not repeated herein. In some embodiments, the material of the at least one isolation structure 200a may include aluminum, titanium, copper, nickel, tungsten, and/or alloys thereof. In some embodiments, the antennas 190 and the isolation structure 200a are formed at the same step, and thus the formation and material of the isolation structure 200a are the same as the formation and the material of the antennas 190. However, the disclosure is not limited thereto. In an alternative embodiment, the antennas 190 may be formed prior to the formation of the isolation structure 200a. In a further alternative embodiment, the antennas 190 may be formed after the formation of the isolation structure 200a. In one embodiment, the isolation structure 200a may be an integral piece. The details of the isolation structure 200a will be described below in conjunction with FIG. 18 and FIG. 19. FIG. 18 is a schematic three-dimensional, partially enlarged perspective view illustrating the isolation structure 200a in FIG. 16, and where the schematic cross-sectional view of FIG. 16 is taken along the cross-sectional line I-I' depicted in FIG. 19.

For example, the isolation structure 200a includes a plurality of through vias 202 and a connecting structure 204 physically connecting all of the through vias 202, as shown in FIG. 16 and FIG. 18. In some embodiments, the through vias 202 are respectively formed in the openings OP and connected to the exposed portions of the metallization layer 118b of the redistribution circuit structure 118. Through the redistribution circuit structure 118, the through vias 120, and the redistribution circuit structure 150, the isolation structure 200a is electrically connected to the semiconductor die 130. In some embodiments, the through vias 202 are electrically connected to one another through the connecting structure 204. The number and the shape of the through vias 202 may be designated and selected based on the demand, and adjusted by changing the number and shape of the openings OP.

In some embodiments, the antennas 190 and the isolation structure 200a are physically separated from one another, and the antennas 190 are surrounded by the isolation structure 200a, as shown in FIG. 16 and FIG. 19. In one embodiment, if considering that the antennas 190a~190d each have different transmitting frequencies, the shape of the connecting structure 204 may include a cross-shape (see FIG. 19) or a shape having a cross portion connecting to and surround by a frame portion (see FIG. 22) for separating the antennas 190 from each other. In one embodiment, if considering that the antennas 190a~190b have a first transmitting frequency and the antennas 190c~190d have a second transmitting frequency different from the first transmitting frequency, the shape of the connecting structure 204 may include a strip shape (see FIG. 20) or a shape having a strip portion connecting to and surround by a frame portion (see FIG. 23) for separating the antennas 190 of different types from each other. In one embodiment, if considering that the antennas 190a~190d have the same transmitting frequency, the shape of the connecting structure 204 may include a frame shape (see FIG. 21) enclosing all the antennas 190. In other words, the shape of the connecting structure 204 in the disclosure is not specifically limited; depending on the types of the antennas 190 (e.g. the antennas 190a~190d), the shape of the connecting structure 204 may include the cross-shape (FIG. 19), a strip shape (FIG. 20), a frame shape (FIG. 21), a shape having a cross portion connecting to and surround by a frame portion (FIG. 22), a shape having a strip portion connecting to and surround by a frame portion (FIG. 23), or the like. Owing to the isolation structure 200a, the antennas 190 having different transmitting frequencies can be grouped into sets respectively located in different regions defining by the shape of the connecting structure 204 of the isolation structure 200a, such that the interference between the antennas 190 having different transmitting frequencies in one package structure 20 and/or among package structures 20 can be suppressed, thereby reducing the surface noise among the antennas 190; the performance of the package structure 20 is further improved.

Continued on FIG. 19 to FIG. 23, in some embodiments, viewing from the top views (e.g. the X-Y plane), the shapes of the package structure 20 and the semiconductor die 130 are square, however the disclosure is not limited thereto. In one embodiment, the isolation structure 200a is overlapped with the semiconductor die 130, see FIG. 19, FIG. 20, FIG. 22, and FIG. 23. In an alternative embodiment, the isolation structure 200a is not overlapped with the semiconductor die 130, see FIG. 21. On the other hand, in the top view (e.g. the X-Y plane), the antennas 190 are spacing apart from the isolation structure 200a, so that the antennas 190 are not overlapped with the isolation structure 200a but overlapped with the semiconductor die 130.

Back to FIG. 18 and FIG. 19, in certain embodiments, along a direction which a width of the connecting structure 204 is measured (e.g. a direction perpendicular to an extending direction of the connecting structure 204), two of the through vias 202 are arranged side-by-side, however the disclosure is not limited thereto. In one embodiment, along the direction which a width of the connecting structure 204 is measured, there may be only one of the through vias 202, see FIG. 20 to FIG. 23. In an alternative embodiment, along the direction which a width of the connecting structure 204 is measured, more than two through vias 202 may be arranged side-by-side.

Referring to FIG. 17, in some embodiments, the conductive elements 170 are released from the holding device HD to form the package structure 20. In some embodiments, a dicing process is performed to cut the wafer having a plurality of the package structures 20 into individual and separated package structures 20 before releasing the conductive elements 170 from the holding device HD. Up to here, the manufacture of the package structure 20 is completed.

Similar to package structure 10, in some embodiments, the package structure 20 may be further mounted with an additional package, chips/dies or other electronic devices to form a stacked package structure or may further include dipole antennas DA, the disclosure is not limited thereto.

Figure 24:
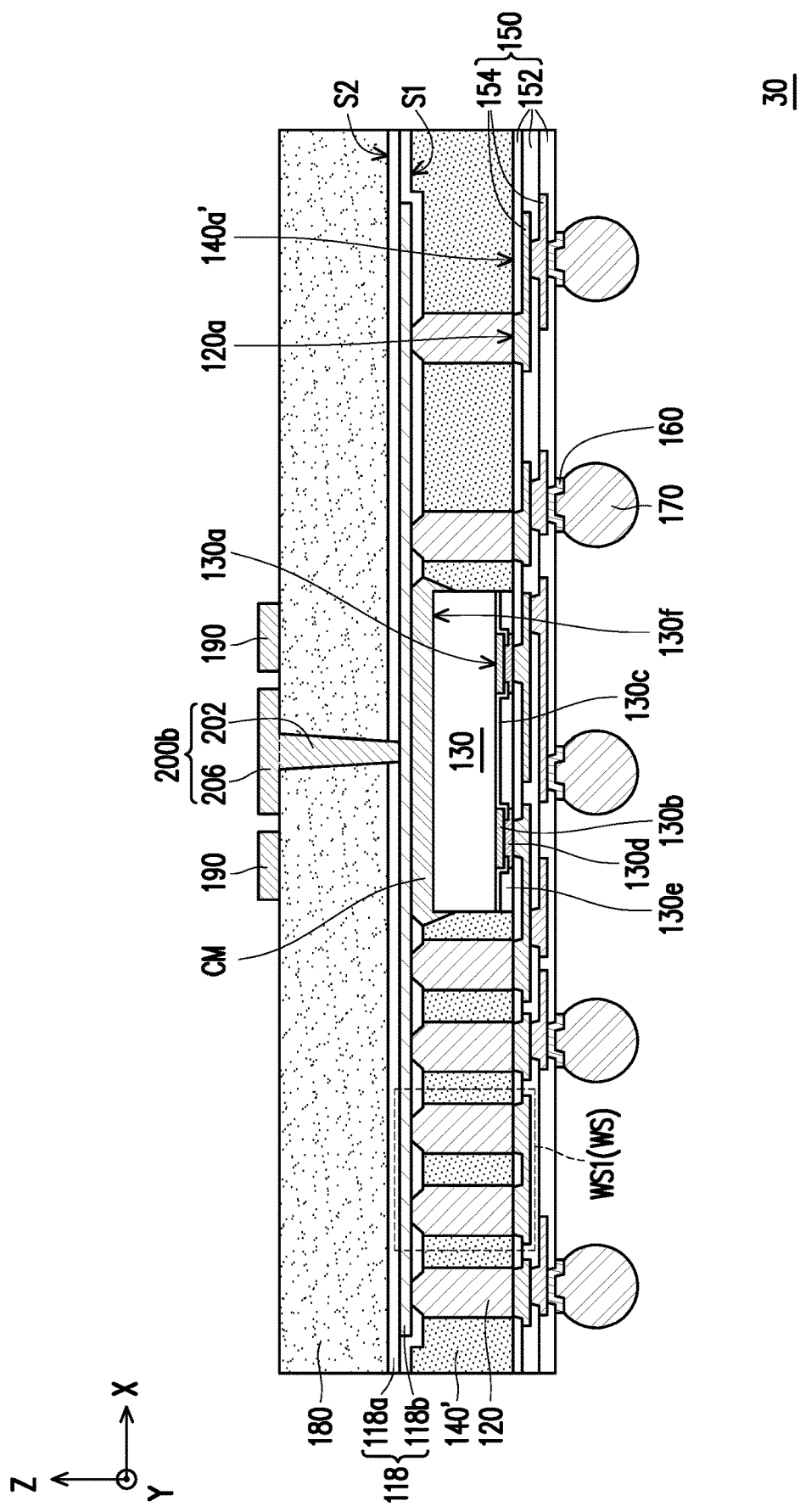
FIG. 24 is a schematic cross-sectional view of a package structure according to some exemplary embodiments of the disclosure.
Figure 25:
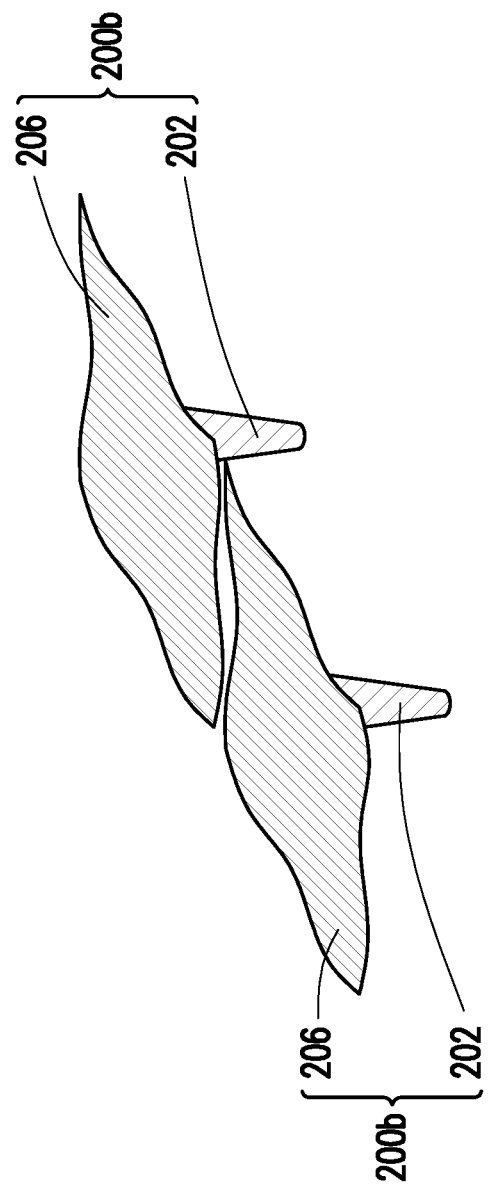
FIG. 25 is a schematic three-dimensional, partially enlarged perspective view of an isolation structure in a package structure according to some exemplary embodiments of the disclosure.
Figure 26:
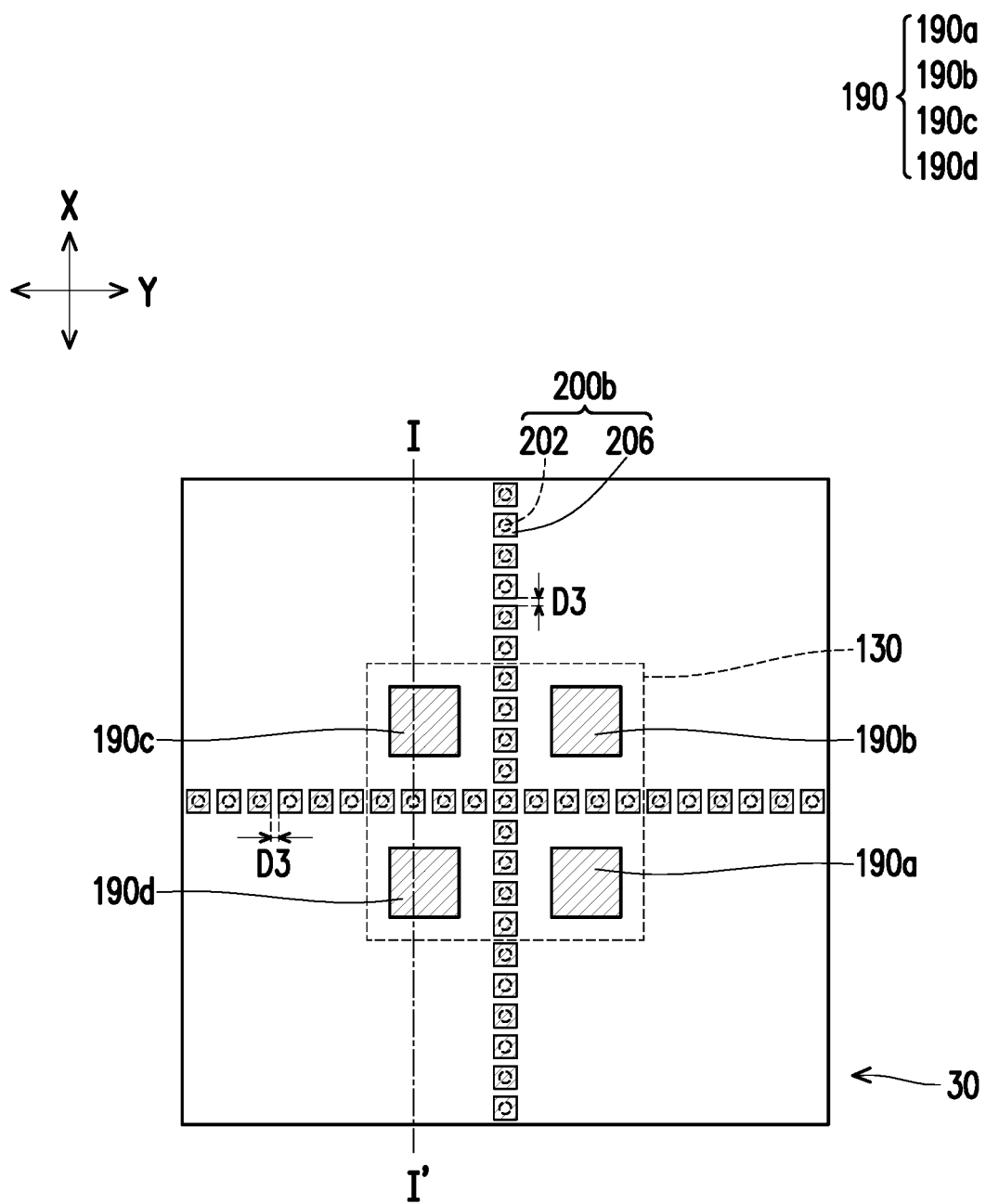
FIG. 26 is a schematic top view illustrating a relative position between antennas, isolation structures and a semiconductor die of a package structure according to some exemplary embodiments of the disclosure.
Figure 27:
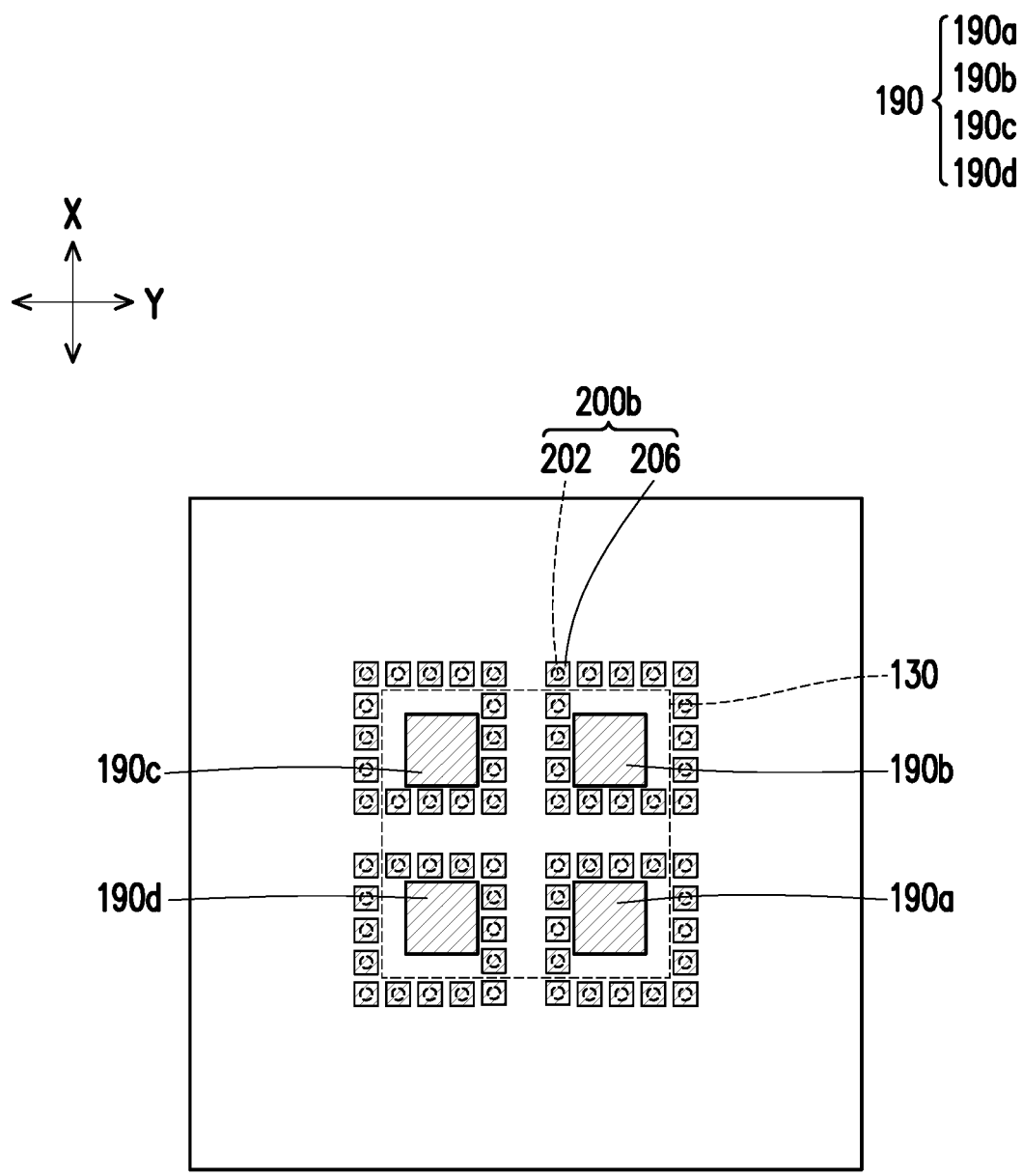
FIG. 27, FIG. 28, FIG. 29, and FIG. 30 are schematic top views illustrating various modifications of a relative position between antennas, isolation structures and a semiconductor die of a package structure according to some exemplary embodiments of the disclosure.
Figure 28:
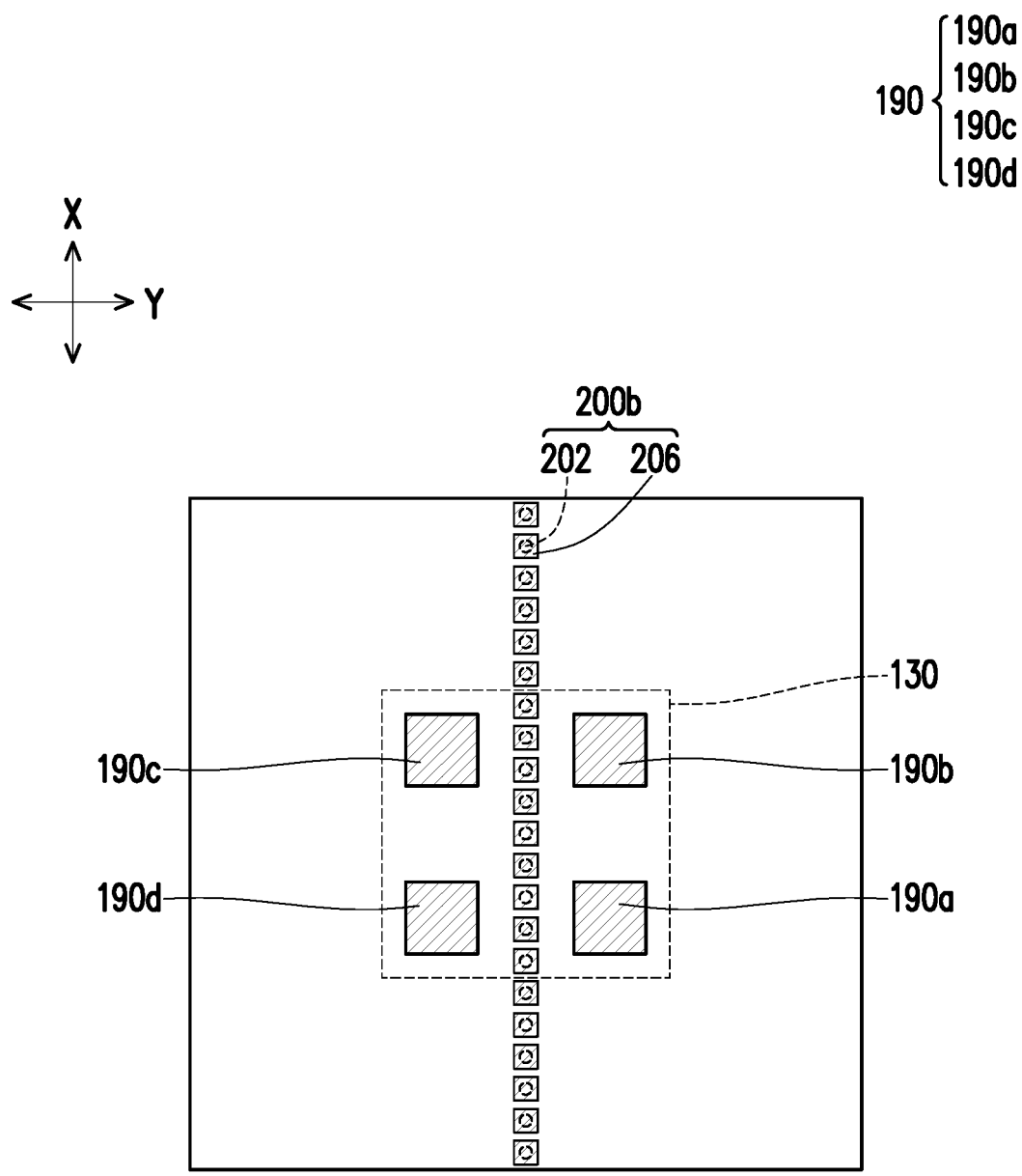
Figure 29:
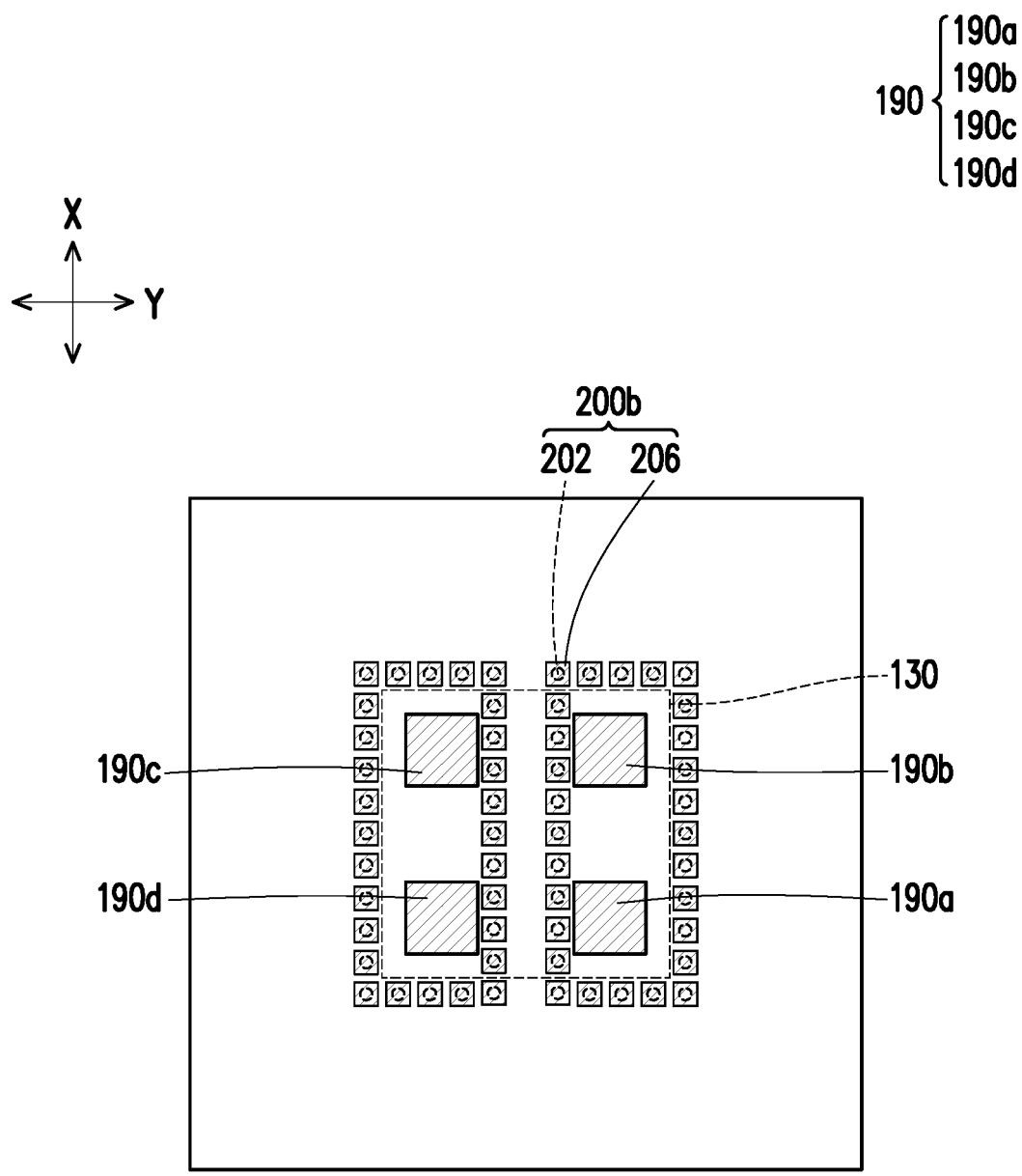
Figure 30:
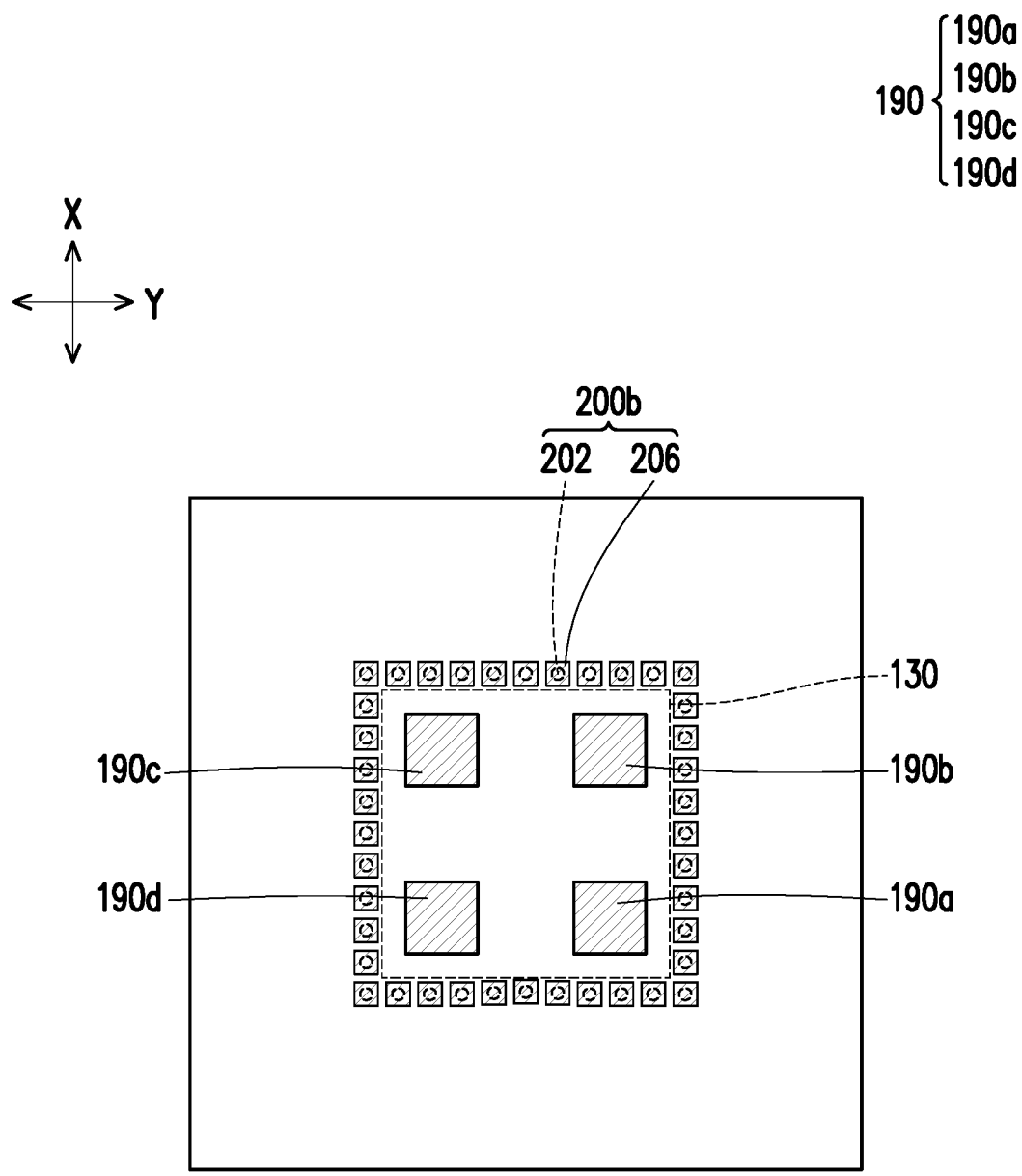

FIG. 24 is a schematic cross-sectional view of a package structure according to some exemplary embodiments of the disclosure. FIG. 25 is a schematic three-dimensional, partially enlarged perspective view of an isolation structure in a package structure according to some exemplary embodiments of the disclosure. FIG. 26 is a schematic top view illustrating a relative position between antennas, isolation structures and a semiconductor die of a package structure according to some exemplary embodiments of the disclosure. FIG. 27, FIG. 28, FIG. 29, and FIG. 30 are schematic top views illustrating various modifications of a relative position between antennas, isolation structures and a semiconductor die of a package structure according to some exemplary embodiments of the disclosure. FIG. 24 is the schematic cross-sectional view taken along the cross-sectional line I-I' depicted in FIG. 26, and the package structure 30 depicted in FIG. 24 and the package structure 20 depicted in FIG. 15 to FIG. 17 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 17 and FIG. 24 together, the difference is that, for the package structure 30 depicted in FIG. 24, the package structure 30 includes a plurality of isolation structures 200b instead of the isolation structure 200a in the package structure 20 depicted in FIG. 17. The details of the isolation structures 200b will be described below in conjunction with FIG. 25 and FIG. 26. FIG. 25 is a schematic three-dimensional, partially enlarged perspective view illustrating the isolation structures 200b in FIG. 24, and where the schematic cross-sectional view of FIG. 24 is taken along the cross-sectional line I-I' depicted in FIG. 26.

For example, each of the isolation structures 200b includes one through via 202 and a connecting structure 206 physically connecting the through via 202, as shown in FIG. 24 and FIG. 25. In some embodiments, for each of the isolation structures 200b, the through via 202 formed in one of the openings OP is in physical connection with the metallization layer 118b of the redistribution circuit structure 118. Through the redistribution circuit structure 118, the through vias 120, and the redistribution circuit structure 150, each of the isolation structures 200b is electrically connected to the semiconductor die 130. In some embodiments, as shown in FIG. 24 and FIG. 25, the isolation structures 200b are separated from each other and are separated from the antennas 190 (including antennas 190a~190d, for example). For example, a distance D3 separating any two adjacent isolation structures 200b is less than or substantially equal to $(\frac{1}{10})\lambda$, $\lambda$ is a wavelength corresponding to the frequency of each antenna 190, and the frequency is chosen depending on the demand and the design layout and is not limited in the disclosure. The distance D3 is referred to as a pitch of the isolation structures 200b. The formation and material of the isolation structures 200b are the same or similar the isolation structure 200a, thus are not repeated therein. The shape of the through vias 202 may be designated and selected based on the demand, and adjusted by changing the shape of the openings OP. The shape of the connecting structure 206 may be designated and selected based on the demand, and may be square, rectangular, triangular, or the other suitable shape.

In some embodiments, the antennas 190 and the isolation structures 200b are formed at the same step, and thus the formation and material of the isolation structures 200b are the same as the formation and the material of the antennas 190. However, the disclosure is not limited thereto. In an alternative embodiment, the antennas 190 may be formed prior to the formation of the isolation structures 200b. In a further alternative embodiment, the antennas 190 may be formed after the formation of the isolation structures 200b. The number of the isolation structures 200b may be designated and selected based on the demand.

In one embodiment, if considering that the antennas 190a~190d each have different transmitting frequencies, the isolation structures 200b may be arranged into a form of a cross-shape (see FIG. 26) or a plurality of frame shapes each surrounding one antenna (see FIG. 27) for separating the antennas 190 from each other. In one embodiment, if considering that the antennas 190a~190b have a first transmitting frequency and the antennas 190c~190d have a second transmitting frequency different from the first transmitting frequency, the isolation structures 200b may be arranged into a form of a strip shape (see FIG. 28) or a plurality of frame shapes each surrounding antennas of the same type (see FIG. 29) for separating the antennas 190 of different types from each other. In one embodiment, if considering that the antennas 190a~190d have the same transmitting frequency, the isolation structures 200b may be arranged into a form of a frame shape (see FIG. 30) enclosing all the antennas 190. In other words, the isolation structures 200b in the disclosure may be arranged into different shapes/patterns depending on the types and number of the antennas 190 (e.g. the antennas 190a~190d) to avoid any interference among the antennas 190.

The disclosure is not limited thereto; and in an alternative embodiment, the isolation structure 200b may be further arranged to be disposed at edges of the package structure 30. Owing to the isolation structures 200b, the antennas 190 having different transmitting frequencies can be grouped into sets respectively located in different regions defining by the isolation structures 200b, such that the interference between the antennas 190 having different transmitting frequencies in one package structure 30 and/or among package structures 30 can be suppressed, thereby reducing the surface noise among the antennas 190; the performance of the package structure 30 is further improved.

In addition, in one embodiment, a package structure (not shown) may simultaneously have both of the isolation structure 200a and the isolation structures 200b. In some embodiments, the package structures 10-30 are designed to operate at millimeter-wave frequency, such as 60 GHz. The disclosure is not limited thereto.

In accordance with some embodiments, a package structure includes a first redistribution circuit structure, a second redistribution circuit structure, at least one semiconductor die, at least one waveguide structure, and an antenna. The at least one semiconductor die is sandwiched between and electrically coupled to the first redistribution circuit structure and the second redistribution circuit structure. The at least one waveguide structure is located aside and electrically coupled to the at least one semiconductor die, wherein the at least one waveguide structure includes a part of the first redistribution circuit structure, a part of the second redistribution circuit structure and a plurality of first through vias each connecting to the part of the first redistribution circuit structure and the part of the second redistribution circuit structure. The antenna is located on the at least one semiconductor die, wherein the second redistribution circuit structure is sandwiched between the antenna and the at least one semiconductor die, and the antenna is electrically communicated with the at least one semiconductor die through the at least one waveguide structure.

In accordance with some embodiments, a package structure includes a first redistribution circuit structure, a second redistribution circuit structure, at least one semiconductor die, at least one waveguide structure, antennas, and at least one first isolation structure. The at least one semiconductor die is sandwiched between and electrically coupled to the first redistribution circuit structure and the second redistribution circuit structure. The at least one waveguide structure is located aside and electrically coupled to the at least one semiconductor die. The antennas are located on the at least one semiconductor die, wherein the second redistribution circuit structure is sandwiched between the antennas and the at least one semiconductor die, and the antennas are electrically communicated with the at least one semiconductor die through the at least one waveguide structure. The at least one first isolation structure is located on and electrically coupled to the second redistribution circuit structure, wherein the at least one first isolation structure is located between and separated apart from the antennas.

In accordance with some embodiments, a method of manufacturing a package structure is provided with the following steps, forming a first redistribution circuit structure; disposing at least one semiconductor die and forming a plurality of through vias on the first redistribution circuit structure, the plurality of through vias being located aside the at least one semiconductor die, and the at least one semiconductor die and the plurality of through vias being electrically connected to the first redistribution circuit structure; encapsulating the at least one semiconductor die and the plurality of through vias in an insulating encapsulation; forming a second redistribution circuit structure on the insulating encapsulation, the at least one semiconductor die and the plurality of through vias being electrically connected to the second redistribution circuit structure so to form at least one waveguide structure aside of the at least one semiconductor die; and disposing an antenna on the second redistribution circuit structure, wherein the second redistribution circuit structure is located between the antenna and the at least one semiconductor die, wherein the at least one semiconductor die is electrically communicated to the antenna through at least one waveguide structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first redistribution circuit structure and a second redistribution circuit structure;
   a semiconductor die, sandwiched between and electrically coupled to the first redistribution circuit structure and the second redistribution circuit structure;
   a conductive adhesive, provided between the first redistribution circuit structure and the semiconductor die and extending toward a sidewall of the semiconductor die;
   at least one waveguide structure, located aside and electrically coupled to the semiconductor die, wherein the at least one waveguide structure comprises:
     a part of the first redistribution circuit structure;
     a part of the second redistribution circuit structure; and
     a plurality of first through vias, each connecting to the part of the first redistribution circuit structure and the part of the second redistribution circuit structure, wherein a channel is located in the at least one waveguide structure and enclosed by the part of the first redistribution circuit structure, the part of the second redistribution circuit structure and the plurality of first through vias; and
   a first antenna, located on the semiconductor die in a stacking direction of the first redistribution circuit structure and the semiconductor die, wherein the first antenna is electrically communicated with the semiconductor die through the at least one waveguide structure.

2. The package structure of claim 1, wherein a signal transmitting from the semiconductor die to the first antenna or transmitting from the first antenna to the semiconductor die is in an electromagnetic wave form propagating inside the channel,
   wherein a distance between two adjacent first through vias of the plurality of first through vias arranged along a direction substantially perpendicular to an extending direction of the channel is approximately from 5 mm to 40 mm,
   wherein a vertical projection of the first antenna is completely within a vertical projection of the semiconductor die, and
   wherein the conductive adhesive further extends into the first redistribution circuit structure and partially covers the sidewall of the semiconductor die.

3. The package structure of claim 2, wherein a shape of the channel comprises a shape in form of a linear line or a shape in form of a curved line having one or more than one bending portions.

4. The package structure of claim 1, further comprising:
an insulating encapsulation, encapsulated the at least one waveguide structure and the semiconductor die, wherein the insulating encapsulation is located between the first redistribution circuit structure and the second redistribution circuit structure; and
conductive elements, located on and connected to the second redistribution circuit structure, wherein the second redistribution circuit structure is sandwiched between the conductive elements and the insulating encapsulation.

5. The package structure of claim 4, further comprising:
a plurality of second through vias, encapsulated in the insulating encapsulation and electrically connected to the semiconductor die, wherein positioning locations of the plurality of second through vias are aside of positioning locations of the plurality of first through vias and a positioning location of the semiconductor die on a vertical projection on the first redistribution circuit structure,
wherein the conductive adhesive is distant from the plurality of second through vias and in contact with a metal feature of the first redistribution circuit structure exposed by a recess formed in an outermost dielectric layer of the first redistribution circuit structure, and
wherein the conductive adhesive is further in contact with the outermost dielectric layer of the first redistribution circuit structure and covers a bottom and a sidewall of the recess.

6. The package structure of claim 1, further comprising:
a first isolation structure, located on the first redistribution circuit structure, wherein the first isolation structure is spacing apart from and electrically isolated from the first antenna.

7. The package structure of claim 6, wherein the first isolation structure comprises:
a plurality of third through vias, penetrating a portion of the first redistribution circuit structure and electrically connected to the first redistribution circuit structure; and
a first connecting structure, located on the semiconductor die, next to the first antenna in the lateral direction, and in contact with the plurality of third through vias, wherein the plurality of third through vias are electrically connected to one another through the first connecting structure.

8. The package structure of claim 1, further comprising:
second isolation structures, located on the first redistribution circuit structure, wherein the second isolation structures are spacing apart from and electrically isolated from the first antenna.

9. The package structure of claim 8, wherein each of the second isolation structures comprises:
a fourth through via, penetrating a portion of the first redistribution circuit structure and electrically connected to the first redistribution circuit structure; and
a second connecting structure, located on the semiconductor die, next to the first antenna in the lateral direction, and in contact with the fourth through via.

10. The package structure of claim 1, wherein the plurality of first through vias are arranged into two lines, wherein:
a width of the channel, which is between one first through via of one of the two lines of the plurality of first through vias and a respective one first through via of other one of the two lines of the plurality of first through vias, is approximately ranging from 5 mm to 40 mm, and
a pitch between any two adjacent first through vias arranged in one of the two lines of the plurality of first through vias is approximately ranging from 200 μm to 600 μm.

11. A package structure, comprising:
a first redistribution circuit structure, having a first side and a second side opposite to the first side along a first direction;
a semiconductor die, disposed over the first side of the first redistribution circuit structure through a conductive connecting material, the conductive connecting material covering a backside and a sidewall of the semiconductor die;
a second redistribution circuit structure, disposed over the semiconductor die;
an insulating encapsulation, laterally encapsulating the semiconductor die and disposed between the first redistribution circuit structure and the second redistribution circuit structure;
at least one waveguide structure, next to and electrically coupled to the semiconductor die, wherein the at least one waveguide structure comprises:
a part of the first redistribution circuit structure;
a part of the second redistribution circuit structure; and
a plurality of first conductive pillars, each connecting to the part of the first redistribution circuit structure and the part of the second redistribution circuit structure;
a plurality of antennas, disposed over the second side of the first redistribution circuit structure, wherein the plurality of antennas are electrically communicated with the semiconductor die through the at least one waveguide structure; and
an encapsulant, disposed between the first redistribution circuit structure and the plurality of antennas.

12. The package structure of claim 11, further comprising:
a plurality of second conductive pillars, disposed over the first side of the first redistribution circuit structure next to the semiconductor die and electrically connecting the first redistribution circuit structure and the second redistribution circuit structure,
wherein the conductive connecting material is distant from the plurality of second conductive pillars,
wherein the conductive connecting material is electrically conductive and is in physical contact with a metallization feature of the first redistribution circuit structure, the metallization feature of the first redistribution circuit structure is exposed by a recess formed in an outermost dielectric layer of the first redistribution circuit structure, and the conductive connecting material is further in contact with the outermost dielectric layer of the first redistribution circuit structure and covers a bottom and a sidewall of the recess,
wherein the conductive connecting material is partially in physical contact with the sidewall of the semiconductor die, and
wherein vertical projections of the plurality of antennas are completely within a vertical projection of the semiconductor die.

13. The package structure of claim 12, wherein the plurality of first conductive pillars and the plurality of second conductive pillars penetrate through the insulating encapsulation and laterally next to each other and to the semiconductor die.

14. The package structure of claim 11, further comprising:
an isolation structure, disposed over the second side of the first redistribution circuit structure next to the plurality of antennas, and comprising:
- a plurality of through vias, penetrating the encapsulant and a portion of the first redistribution circuit structure; and
- a connecting structure, disposed on the encapsulant and connecting to the plurality of through vias, wherein the plurality of through vias are electrically coupled to one another through the connecting structure.

15. The package structure of claim 14, wherein the isolation structure is electrically coupled to the semiconductor die and electrically isolated from the plurality of antennas.

16. A package structure, comprising:
an insulating encapsulation;
at least one semiconductor die, encapsulated in the insulating encapsulation;
a conductive paste, covering a backside of the at least one semiconductor die, wherein a portion of the conductive paste is between the insulating encapsulation and the at least one semiconductor die;
a waveguide structure, located aside and electrically coupled to the at least one semiconductor die and encapsulated in the insulating encapsulation;
antennas, disposed over the at least one semiconductor die, wherein the antennas are electrically connected to the waveguide structure in a manner of electrical coupling, and the antennas are electrically communicated with the at least one semiconductor die through the waveguide structure;
at least one isolation structure, disposed over the at least one semiconductor die, wherein the at least one isolation structure laterally separates apart the antennas, and the at least one isolation structure is electrically coupled to the at least one semiconductor die and is electrically isolated from the antennas; and
a plurality of conductive pillars, encapsulated in the insulating encapsulation next to the waveguide structure, and electrically connected to the at least one semiconductor die.

17. The package structure of claim 16, further comprising:
a first redistribution circuit structure, disposed on a first side of the insulating encapsulation and electrically connected to the at least one semiconductor die;
a second redistribution circuit structure, disposed on a second side of the insulating encapsulation and electrically connected to the at least one semiconductor die, wherein the first side is opposite to the second side in a stacking direction of the antennas and the at least one semiconductor die; and
an encapsulant, sandwiched between the antennas and the first redistribution circuit structure,
wherein the at least one isolation structure comprises:
- a plurality of through vias, penetrating the encapsulant and a portion of the first redistribution circuit structure and electrically connected to the first redistribution circuit structure; and
- a connecting structure, disposed on the encapsulant and in contact with the plurality of through vias, wherein the plurality of through vias are electrically connected to one another through the connecting structure.

18. The package structure of claim 16, further comprising:
a first redistribution circuit structure, disposed on the insulating encapsulation and electrically connected to the at least one semiconductor die, wherein the first redistribution circuit structure is disposed between the antennas and the insulating encapsulation;
a second redistribution circuit structure, disposed on the insulating encapsulation and electrically connected to the at least one semiconductor die, wherein the insulating encapsulation is disposed between the first redistribution circuit structure and the second redistribution circuit structure; and
conductive elements, disposed on and connected to the second redistribution circuit structure, wherein the second redistribution circuit structure is sandwiched between the conductive elements and the insulating encapsulation,
wherein the conductive paste is distant from the plurality of conductive pillars,
wherein the conductive paste is electrically conductive and is in physical contact with a metallization feature of the first redistribution circuit structure, the metallization feature of the first redistribution circuit structure is exposed by a recess formed in an outermost dielectric layer of the first redistribution circuit structure, and the conductive paste is further in contact with the outermost dielectric layer of the first redistribution circuit structure and covers a bottom and a sidewall of the recess,
wherein the conductive paste is partially in physical contact with a sidewall of the at least one semiconductor die, and
wherein vertical projections of the antennas are completely within a vertical projection of the at least one semiconductor die.

19. The package structure of claim 16, wherein a signal transmitting from the at least one semiconductor die to the antennas or transmitting from the antennas to the at least one semiconductor die is in an electromagnetic wave form propagating inside a channel located in the waveguide structure.

20. The package structure of claim 19, wherein a shape of the channel comprising a shape in form of a linear line or a shape in form of a curved line having one or more than one bending portions.

* * * * *